US010073337B2

(12) United States Patent
Jung et al.

(10) Patent No.: US 10,073,337 B2
(45) Date of Patent: Sep. 11, 2018

(54) PELLICLE AND PHOTOMASK ASSEMBLY INCLUDING THE SAME

(71) Applicant: Samsung Electronics Co., Ltd., Suwon-si, Gyeonggi-do (KR)

(72) Inventors: Yong-seok Jung, Seoul (KR); Hwan-chul Jeon, Seoul (KR); Byung-gook Kim, Seoul (KR); Jae-hyuck Choi, Seoul (KR); Sung-won Kwon, Suwon-si (KR)

(73) Assignee: SAMSUNG ELECTRONICS CO., LTD., Gyeonggi-do (KR)

( * ) Notice: Subject to any disclaimer, the term of this patent is extended or adjusted under 35 U.S.C. 154(b) by 6 days.

(21) Appl. No.: 15/155,444

(22) Filed: May 16, 2016

(65) Prior Publication Data

US 2017/0038676 A1    Feb. 9, 2017

(30) Foreign Application Priority Data

Aug. 3, 2015 (KR) .................. 10-2015-0109574

(51) Int. Cl.
*G03F 1/64* (2012.01)
*G03F 1/62* (2012.01)

(52) U.S. Cl.
CPC . *G03F 1/64* (2013.01); *G03F 1/62* (2013.01)

(58) Field of Classification Search
None
See application file for complete search history.

(56) References Cited

U.S. PATENT DOCUMENTS

| 7,666,555 | B2 | 2/2010 | Goldstein et al. |
|---|---|---|---|
| 8,383,297 | B2 | 2/2013 | Shirasaki et al. |
| 8,535,545 | B2 | 9/2013 | Kim |
| 9,119,898 | B2 | 9/2015 | Bayon et al. |
| 2005/0040345 | A1* | 2/2005 | Bakker ............... B82Y 10/00 250/492.2 |
| 2005/0151955 | A1 | 7/2005 | Laganza et al. |
| 2008/0113491 | A1 | 5/2008 | Wood et al. |
| 2008/0152873 | A1 | 6/2008 | Okoroanyanwu et al. |
| 2011/0214728 | A1 | 9/2011 | Veerasamy |
| 2011/0249243 | A1 | 10/2011 | Sjmaenok et al. |
| 2017/0038675 | A1* | 2/2017 | Ahn .................... H01L 21/027 |

FOREIGN PATENT DOCUMENTS

| KR | 10-2011-0028978 | 3/2011 |
|---|---|---|
| KR | 10-2012-0064848 | 6/2012 |
| KR | 10-2013-0046619 | 5/2013 |
| KR | 10-2013-0074066 | 7/2013 |
| KR | 10-2014-0078319 | 6/2014 |

OTHER PUBLICATIONS

"Bright future for gaN nanowires", Nov. 20, 2011, http://phys.org/news/2011-11-bright-future-gan-nanowires.html.
"Gold sets nanowires straight", Nov. 1, 2007, http://www.rsc.org/chemistryworld/news/2007/november/01110701.asp.

* cited by examiner

*Primary Examiner* — Christopher G Young
(74) *Attorney, Agent, or Firm* — Harness, Dickey & Pierce, P.L.C.

(57) ABSTRACT

A pellicle includes a pellicle membrane, which includes a porous thin film. The porous thin film includes a plurality of nanowires, which are arranged across one another to form a net structure. A photomask assembly includes the pellicle and a photomask, wherein the pellicle is fixed to a surface of the photomask.

20 Claims, 46 Drawing Sheets

NWC

520A

520D

PELLICLE AND PHOTOMASK ASSEMBLY INCLUDING THE SAME

CROSS-REFERENCE TO RELATED APPLICATION

This application claims priority under 35 U.S.C. § 119 to Korean Patent Application No. 10-2015-0109574, filed on Aug. 3, 2015, in the Korean intellectual Property Office, the disclosure of which is incorporated herein in its entirety by reference.

BACKGROUND

1. Field

Inventive concepts relate to integrated circuit (IC) device manufacturing apparatuses, and more particularly, to a pellicle used for exposure apparatuses configured to manufacture IC devices and photomask assemblies including the pellicles.

2. Description of the Related Art

In a process of manufacturing the IC devices, a lithography process is employed to form a circuit pattern on a wafer. In the lithography process, a photomask is used to transfer a desired pattern onto the wafer. When the photomask is contaminated with foreign materials, such as particles, from the ambient environment or deformed due to the ambient environment, defects may occur on the wafer to which the pattern of the photomask is transferred.

SUMMARY

To improve productivity during the process of manufacturing the IC device, at least some example embodiments disclose a system capable of protecting the photomask used for the lithography process from foreign materials or the ambient environment.

Inventive concepts provide a pellicle, which may protect a photomask from contamination during the keeping, transportation, and use of the photomask. Inventive concepts may further provide a high resolution and a mechanically stable structure when the pellicle is used for exposure processes.

Inventive concepts provide a photomask assembly including a pellicle, which may provide a high resolution with respect to extreme ultraviolet (EUV) light or electron beams (e-beams) and have a mechanically stable structure.

According to at least one example embodiment of inventive concepts, there is provided a pellicle including a pellicle membrane. The pellicle membrane includes a porous film, and the porous film includes a plurality of nanowires, the plurality of nanowires are patterned across one another.

The porous thin film may define a plurality of holes that extend along a thickness of the porous film. The plurality of nanowires define the plurality of holes such that the plurality of holes may extend along a linear path and a nonlinear path. In some example embodiments, the plurality of nanowires define the plurality of holes such that the plurality of holes may include a plurality of irregularly patterned through holes. In at least some example embodiments, the plurality of nanowires define the plurality of holes such that the plurality of holes formed in the porous film may include a plurality of regularly patterned through holes.

At least some of the plurality of nanowires may have a first portion and a second portion. The first portion may be unified with the second portion of the plurality of nanowires, to form the net structure.

At least some of the plurality of nanowires may be adhered under pressure to one another and the at least some of the plurality of nanowires may provide the net structure.

Each of the plurality of nanowires may have a circular sectional shape, an elliptical sectional shape, and a polygonal sectional shape.

The plurality of nanowires may be in at least one of an unfolded state and a folded state, or a combination thereof, in a lengthwise to form the net structure.

In at least some example embodiments, the plurality of nanowires may include a single element. In at least some other example embodiments, each of the plurality of nanowires may have a hetero structure, the hetero structure includes at least two different elements.

The plurality of nanowires may include a material selected from the group consisting of silicon (Si), carbon (C), nickel (Ni), platinum (Pt), gold (Au), ruthenium (Ru), indium phosphide (InP), gallium nitride (GaN), silicon nitride ($Si_3N_4$), silicon dioxide ($SiO_2$), titanium dioxide ($TiO_2$), yttrium barium copper oxide (YBCO), and silicon carbide (SiC), and a combination thereof.

In at least some example embodiments, each of the plurality of nanowires may include an element doped with an n-type dopant or a p-type dopant.

Each of the plurality of nanowires may have a width of about 5 nm (nanometer) to about 100 nm in a thickness of each of the plurality of nanowires. The porous film may have a thickness of about 50 nm to about 4 µm (micrometer).

At least some of the plurality of nanowires may include a core wire and a shell wire, and the shell wire surrounds the core wire. The core wire may include a first material and the shell wire may include a second material, and the first material may be different from the second material.

The pellicle membrane may further include a capping layer, the capping layer covering at least one surface of the porous thin film. In some example embodiments, the capping layer may cover the first surface of the porous film and a second surface of the porous film, and the first surface of the porous film and the second surface on opposing sides of the porous film. In some example embodiments, the capping layer may include a first material, and the porous film includes a second material, wherein the first material is different from the second material. The capping layer may include a first material selected from the group consisting of silicon carbide (SiC), silicon dioxide ($SiO_2$), silicon nitride ($Si_3N_4$), silicon oxynitride (SiON), yttrium oxide ($Y_2O_3$), yttrium nitride (YN), barium carbide ($BaC_2$), barium nitride ($Ba(NO_3)_2$), molybdenum (Mo), ruthenium (Ru), and rhodium (Rh), and a combination thereof.

The pellicle may further include a pellicle frame which supports the pellicle membrane. The pellicle frame may be adhered to the porous thin film by an adhesive layer. The pellicle membrane may further include a capping layer, the capping layer covers a first surface of the porous thin film. The pellicle frame may be adhered to the capping layer by an adhesive layer.

According to example embodiments of inventive concepts, there is provided a photomask assembly comprising a pellicle and a photomask. The pellicle may include a pellicle membrane, the pellicle membrane may include a porous film, and the porous thin film includes a plurality of nanowires patterned across one another to form a net structure. The photomask may include a surface, wherein the pellicle is fixed to the surface of the photomask.

The plurality of nanowires define a plurality of holes such that the plurality of holes extend along at least one of a linear path and a nonlinear path.

In at least some example embodiments, the plurality of nanowires define the plurality of holes such that at least some of the plurality of holes may be irregularly shaped and irregularly patterned. Alternatively, the plurality of nanowires define the plurality of holes such that the plurality of holes form plurality of regularly patterned spaces.

In the photomask assembly, the pellicle membrane may further include a capping layer that covers a first surface of the porous film.

The pellicle may further include a pellicle frame including a first end and a second end, the first end may be fixed to the pellicle membrane, and the second end may be fixed to the surface of the photomask.

According to at least some example embodiments, a pellicle membrane includes a porous film including a first surface, and a plurality of nanowires in the porous film. The plurality of nanowires may form the porous film. A first nanowire being unified with a second nanowire of the plurality of nanowires, the first nanowire and the second nanowire may be patterned across one another. The first surface may be thicker than each of the plurality of nanowires. Each of the plurality of nanowires may include one of a circular sectional shape, an elliptical sectional shape, and a polygonal sectional shape. The plurality of nanowires may define plurality of holes that extend along a thickness of the porous film. Alternatively, the plurality of nanowires may define the plurality of holes such that the plurality of holes extend along at least one of a linear path and a nonlinear path.

BRIEF DESCRIPTION OF THE DRAWINGS

The foregoing and other features and advantages of inventive concepts will be apparent from the more particular description of example embodiments of inventive concepts, as illustrated in the accompanying drawings in which like reference characters refer to the like parts throughout the different views. The drawings are not necessarily to scale, emphasis instead being placed upon illustrating the principles of inventive concepts. In the drawings.

DETAILED DESCRIPTION OF EXAMPLE EMBODIMENTS

Figure 1:
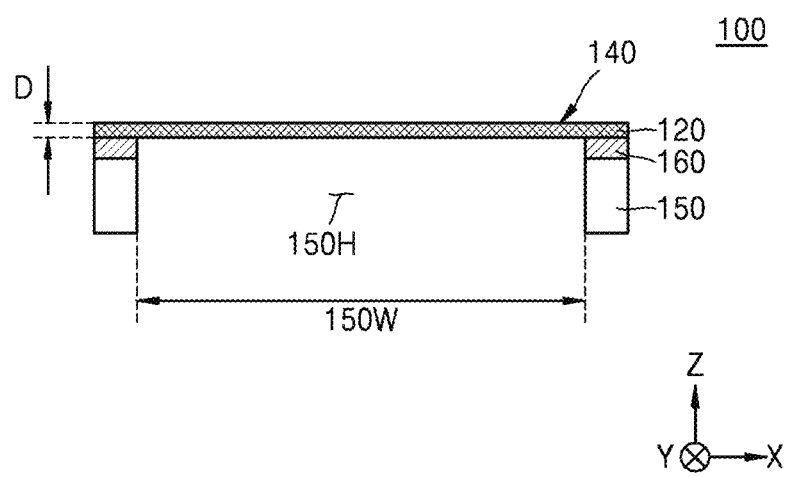
FIG. 1 is a cross-sectional view of a pellicle according to an example embodiment.

Example embodiments of inventive concepts will now be described more fully with reference to the accompanying drawings, in which some example embodiments of inventive concepts are shown. Example embodiments may, however, be embodied in different forms and should not be construed as being limited to the embodiments set forth herein. Rather, these example embodiments are provided so that this disclosure is thorough and complete, and fully convey the scope of example embodiments of inventive concepts to one of ordinary skill in the art. In the drawings, the thicknesses of layers and regions are exaggerated for clarity. Like reference numerals in the drawings denote like elements, and thus descriptions thereof will be omitted.

It will be understood that, although the terms "first", "second", etc., may be used herein to describe various elements, components, regions, layers and/or sections. These elements, components, regions, layers and/or sections should not be limited by these terms. These terms are only used to distinguish one element, component, region, layer or section from another element, component, region, layer or section. Thus; a first element, component, region, layer or section, as discussed below, could be termed a second element, component, region, layer and/or section, without departing from the teachings of example embodiments.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements or layers should be interpreted in a like fashion "between" versus "directly between," "adjacent" versus "directly adjacent," "on" versus "directly on"). As used herein the term "and/or" includes any and all combinations of one or more of the associated listed items.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises", "comprising", "includes" and/or "including," if used herein, specify the presence of stated features, integers, steps, operations, elements and/or components, but do not preclude the presence or addition of one or more other features, integers, steps, operations, elements, components and/or groups thereof. Expressions such as "at least one of," when preceding a list of elements, modify the entire list of elements and do not modify the individual elements of the list. Unless otherwise defined, all terms (including technical and scientific terms) used herein have the same meaning as commonly understood by one of ordinary skill in the art to which example embodiments belong. It will be further understood that terms, such as those defined in commonly used dictionaries, should be interpreted as having a meaning that is consistent with their meaning in the context of the relevant art and this specification, and will not be interpreted in an idealized or overly formal sense unless explicitly so defined herein.

When some example embodiments may be embodied otherwise, respective process steps described herein may be performed otherwise. That is, for example, two process steps described in a sequential order may be performed around the same time, or in reverse order.

Variations from the shapes of the illustrations as a result, for example, of manufacturing techniques and/or tolerances, are to be expected. Thus, example embodiments of inventive concepts should not be construed as limited to the particular shapes of regions illustrated in the present application. Instead, example embodiments of inventive concepts are to include deviations in shapes that result, for example, from manufacturing. As used herein, the term "and/or" includes any and all combinations of one or more of the associated listed items. For example, when a term "substrate" is used herein, it should be understood as either the substrate itself or both the substrate and a stack structure including a predetermined (and/or selected (or desired)) layer or film formed on the substrate. Also, when an expression "surface of the substrate" is used herein, it should be understood as either an exposed surface of the substrate itself, an outer surface of a predetermined (and/or selected (or desired)) layer, and/or film formed on the substrate. When a term "nanowire" is used herein, it should be understood as a nanostructure having a diameter of about 100 nm (nanometer) or less and a length of several μm (micrometer) or more.

To apply a lithography technique using extreme ultraviolet (EUV) light or electronic beams (e-beams) to mass production, there may be issues to take into account. One issue may be to control damage from foreign materials generated during a lithography process. The foreign materials generated during the lithography process may contaminate a photomask, and the contamination of the photomask may cause errors in an exposure process, and a reduction in the lifespan of the photomask. In particular, for example, a lithography technique using the EUV light may exhibit a much higher resolution than when an ArF (argon fluoride) scanner is used. However, since the lithography technique using the EUV light uses light having a short wavelength, there may be a possibility of transferring defects on the photomask to a wafer to be exposed. Accordingly, for example, a EUV photomask having only allowable defects may be used and particles on the photomask are managed on an allowable level or lower.

Example embodiments provide a pellicle, which may protect a photomask from external defective elements during an exposure process, and limit and/or prevent damage caused by foreign materials. In particular, at least one example embodiment provides a pellicle having a pellicle membrane, which may ensure structural stability and have a high transmittance with respect to the wavelength of the EUV light. In example embodiments, the pellicle may limit and/or prevent thermal damage due to an exposure process. Even if an additional vent hole for outgassing is not prepared, the pellicle may limit and/or prevent contaminants and/or foreign particles from being adsorbed and left on a fine pattern of the photomask. The contaminants and/or foreign particles may grow on the photomask due to a photochemical reaction, which uses ultraviolet (UV) light irradiated during a photolithography process as activation energy and, thereby, resulting in haze defects to the surface of the photomask.

FIG. 1 is a cross-sectional view of a pellicle 100 according to an example embodiment.

Referring to FIG. 1, the pellicle 100 may include a pellicle membrane 140 and a pellicle frame 150. The pellicle frame 150 may support the pellicle membrane 140. The pellicle membrane 140 may include a porous thin film 120.

The pellicle frame 150 may be adhered to the porous thin film 120 by an adhesive layer 160. The pellicle frame 140 may be evenly maintained to have a free-standing structure on the pellicle membrane 150.

The porous thin film 120 may have a thickness D of about 50 nm (nanometer) to about 4 μm (micrometer).

Conventionally, a lithography process using extreme ultraviolet (EUV) light may be performed by using the pellicle membrane with a sufficiently thin thickness to transmit EUV light. The pellicle membrane may have a small thickness of about several nm to about 20 nm. However, where the pellicle includes the thin pellicle membrane, it may be difficult to stably fix the pellicle membrane having the free-standing structure on the pellicle. Thus, to improve the structural instability of the pellicle membrane, an additional support structure may be used, such as a net structure and/or a grid. However, the net structure and/or the grid, which may form the support structure for the pellicle membrane, may cause image errors during an exposure process.

In contrast, the porous thin film 120 included in the pellicle membrane 140 according to example embodiments may have a relatively large thickness D (compared to conventional pellicle membranes) of about 50 nm to about 4 µm. Since the porous thin film 120 has a relatively large thickness D, the pellicle membrane 140 may provide mechanical stability, and structural stability to the pellicle 100. Accordingly, an additional support structure for stably supporting the pellicle membrane 140 on the pellicle frame 150 may not be needed.

According to at least some example embodiments, the porous thin film 120 may include a plurality of nanowires, which may be arranged across one another to form a net-like structure.

FIGS. 2A to 2D are schematic plan views of porous thin films 120A, 120B, 120C, and 120D having various structures, each of which may be included in the pellicle 100 shown in FIG. 1, according to an example embodiment.

FIGS. 2A to 2D illustrate the porous thin films 120A, 120B, 120C, and 120D having specific shapes and various planar configurations of the porous thin film 120. However, according to inventive concepts, the configuration of the porous thin film 120 shown in FIG. 1 is not limited to the examples shown in FIGS. 2A to 2D. Instead, the shape and planar configurations of the porous thin film 120 may be variously changed within the scope of inventive concepts.

Referring to FIGS. 2A to 2D, a plurality of holes H1, H2, H3, and H4 may be formed in the porous thin films 120A, 120B, 120C, and 120D, respectively. Holes H1 shown in FIG. 2A, for example, may penetrate the porous thin film 120A in a thickness direction (i.e., Z direction). The porous thin films 120A, 120B, 120C, and 120D, as shown in FIGS. 2A to 2D may be formed of plurality of nanowires NW1, NW2, NW3 and NW4, respectively.

Since the plurality of nanowires NW1, NW2, NW3, and NW4, which may form the porous thin films 120A, 120B, 120C, and 120D, respectively, are arranged across one another, as shown in FIGS. 2A to 2D, to form net-like structures, the plurality of holes H1, H2, H3, and 114 may be prepared by spaces defined by the plurality of nanowires NW1, NW2, NW3, and NW4, respectively.

The plurality of holes H1, H2, H3, and H4 may penetrate the porous thin films 120A, 120B, 120C, and 120D in a thickness direction. The plurality of holes H1, H2, H3, and H4 may each have a first end portion exposed by a front-side surface of the porous thin films 120A, 120B, 120C, and 120D, and a second end portion exposed by a backside surface of the porous thin films 120A, 120B 120C, and 120D. The plurality of holes H1 H2, 113, and H4 may penetrate the porous thin films 120A, 120B, 120C, and 120D along at least one of a linear path and a nonlinear path, or a combination thereof in the thickness directions of the porous thin films 120A, 120B, 120C, and 12D, respectively.

Figure 2A:
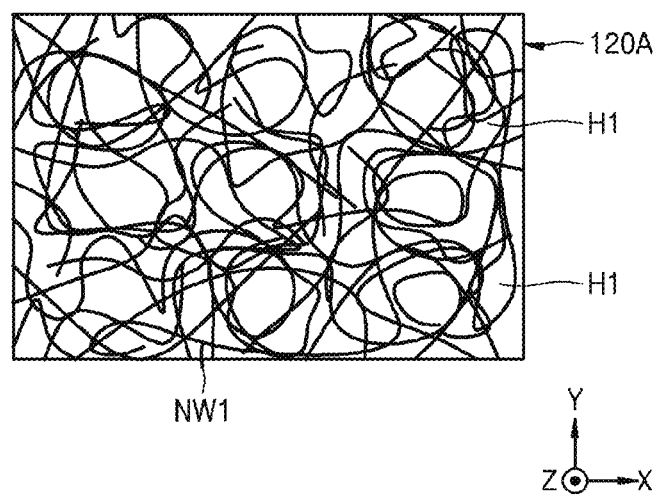
FIGS. 2A to 2D are schematic plan views of a porous thin film that may be included in a pellicle according to an example embodiment.
Figure 2B:
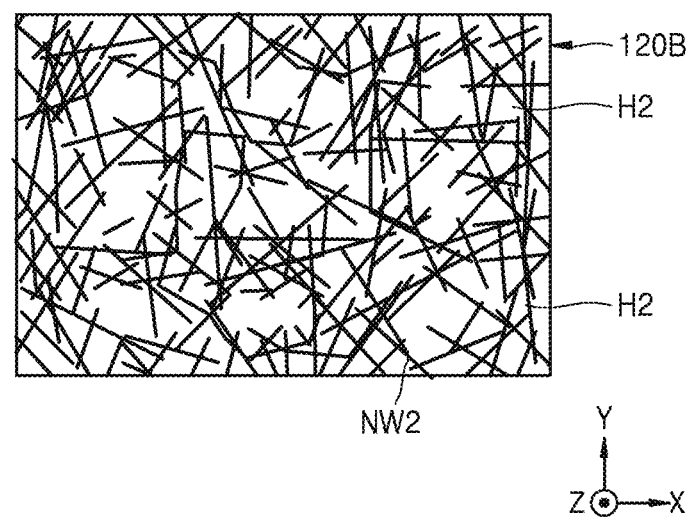
Figure 2C:
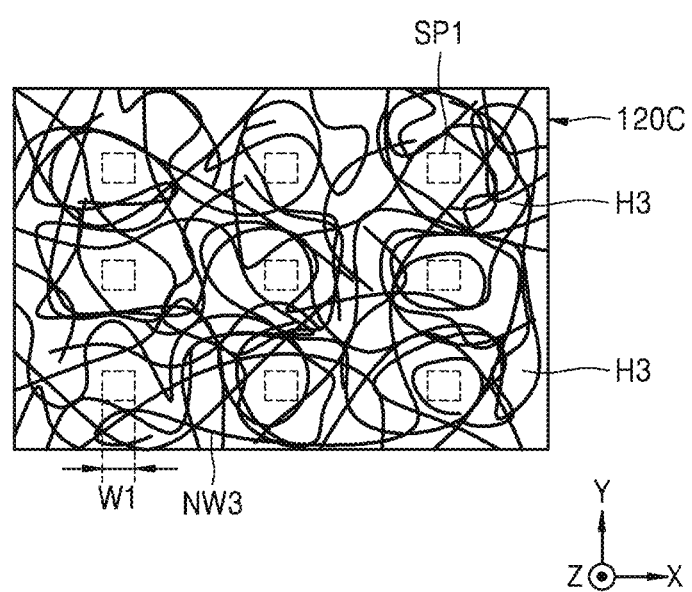

In some example embodiments, as shown in FIGS. 2A and 2C, the plurality of nanowires NW1 and NW3 may be gently bent at various slopes and arranged across each other to form a net-like structure. The plurality of holes H1 and H3 provided by the plurality of nanowires NW1 and NW3, respectively, may be irregularly shaped and/or irregularly arranged.

Figure 2D:
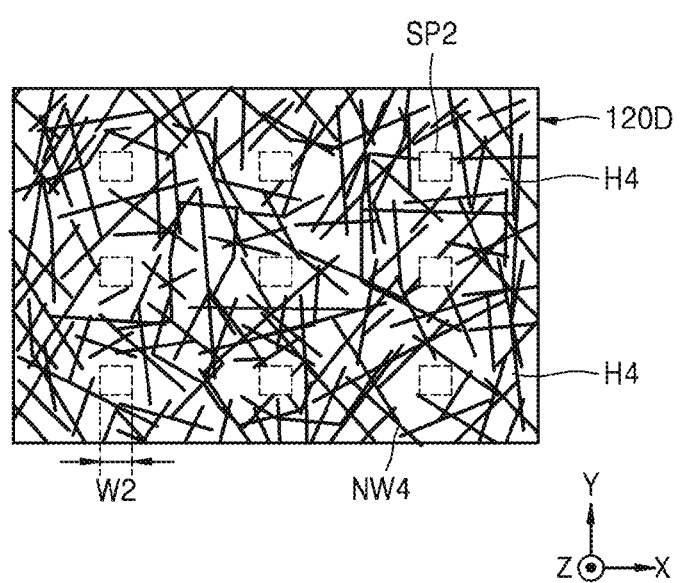

In at least some example embodiments, as shown in FIGS. 2B and 2D, the plurality of nanowires NW2 and NW4 may be irregularly arranged in straight lines, such as needles, across one another to form a net-like structure. The plurality of holes H2 and H4 provided by the plurality of nanowires NW2 and NW4, respectively, may be irregularly shaped and/or irregularly arranged.

In at least some example embodiments, as shown in FIGS. 2C and 2D, at least some of the plurality of holes H3 and H4 may be arranged to form a plurality of regularly arranged spaces, for example, spaces SP1 and SP2. The plurality of spaces SP1 and SP2 may have widths W1 and W2, respectively, of about 0.01 µm (micrometer) to about 0.1 µm, and be arranged at regular intervals. However, the plurality of spaces SP1 and SP2, shown in FIGS. 2C and 2D, may be non-limiting examples, and sizes of the plurality of spaces SP1 and SP2, and distance between the plurality of spaces SP1 and SP2, may be variously modified.

In at least some example embodiments, the plurality of nanowires NW1, NW2, NW3, and NW4 that constitute the porous thin films 120A, 120B, 120C, and 120D, respectively, may be arranged across one another at a density of about 0.01 g/cm$^3$ to about 2 g/cm$^3$. Densities of the plurality of nanowires NW1, NW2, NW3, and NW4 in per unit area in the porous thin films 120A, 120B, 120C, and 120D may be the same over the entire area of the porous thin films 120A, 120B, 120C, and 120D, respectively. Alternatively, densities of the plurality of nanowires NW1, NW2, NW3, and NW4 may be different in respective regions of the porous thin films 120A 120B, 120C, and 120D. Densities of the plurality of nanowires NW1, NW2, NW3, and NW4 per unit area in the porous thin films 120A, 120B, 120C, and 120D may be about 20% or less of a density of a bulk material, which is the same material as a material included in the plurality of nanowires NW1, NW2, NW3, and NW4.

In the porous thin films 120A, 120B, 120C, and 120D, the plurality of nanowires NW1, NW2, NW3, and NW4 may have uniform widths and/or diameters, or different widths and/or diameters. In at least some example embodiments, the plurality of nanowires NW1, NW2, NW3, and NW4 may have widths and/or diameters, which are selected in the range of about 5 nm (nanometer) to about 100 nm, in a thickness direction of each of the plurality of nanowires.

In at least some example embodiments, at least some of the plurality of nanowires NW1, NW2, NW3, and NW4 may be unified with one another and provide net-like structures in the porous thin films 120A, 120B, 120C, and 120D. In some example embodiments, at least some of the plurality of nanowires NW1, NW2, NW3, and NW4 may be adhered under pressure to each other, and provide net-like structures in the porous thin films 120A, 120B, 120C, and 120D. In at least some other example embodiments, the plurality of nanowires NW1, NW2, NW3, and NW4 may be in an unfolded state, a folded state, and/or a combination thereof, in a lengthwise direction of each of the plurality of nanowires, and provide net-like structures for the porous thin films 120A, 120B, 120C, and 120D.

According to some example embodiments, the plurality of nanowires NW1, NW2, NW3, and NW4 may have various sectional shapes, for example, including but not limited to, a circular sectional shape, an elliptical sectional shape, or a polygonal sectional shape.

FIGS. 3A to 3H are perspective views of nanowires having various shapes, which may constitute a plurality of nanowires included in the porous thin film 120 of FIG. 1, according to an example embodiment.

As shown in FIGS. 3A to 3H, a plurality of nanowires included in the porous thin film 120 of FIG. 1 may have a structure that is equal to and/or similar to at least one selected from the group consisting of, including but not limited to, a nanowire NWA having a circular sectional shape, a nanowire NWB having a square sectional shape, a nanowire NWC having a hexagonal sectional shape, a nanowire NWD having a tube shape, a nanowire NEW having a belt shape, a mesoporous nanowire NWF having a plurality of pores PO, a nanowire NWG having a crossed structure, and a nanowire NWH having a branched structure, for example, a tetrapod structure. However, example embodiments of inventive concepts are not limited to the examples shown in FIGS. 3A to 3H, and the porous thin film 120 may include nanowires having various shapes.

In at least some example embodiments, the plurality of nanowires included in the porous thin film 120 may have a structure of at least one of the nanowires NWA, NWB, NWC, NWD, NWE, NWF, NWG, and NWH, as shown in FIGS. 3A to 3H. The nanowires shown in FIGS. 3A to 3H may be modified and changed within the scope of inventive concepts.

In at least some example embodiments, the plurality of nanowires included in the porous thin film 120 of FIG. 1 may include a material selected from the group consisting of, including but not limited to, silicon (Si), carbon (C), nickel (Ni), platinum (Pt), gold (Au), ruthenium (Ru), indium phosphide (InP), gallium nitride (GaN), silicon nitride ($Si_3N_4$), silicon dioxide ($SiO2$), titanium dioxide ($TiO2$), yttrium barium copper oxide (YBCO), silicon carbide (SiC), and/or a combination thereof.

The plurality of nanowires (e.g., the plurality of nanowires NW1, NW2, NW3, and NW4 shown in FIGS. 2A to 2D), which may form the porous thin film 120 of FIG. 1 may include a single element and/or have a hetero structure including at least two different kinds of elements.

FIGS. 4A to 4F are diagrams of example embodiments of structures of nanowires that may constitute the porous thin film 120 of FIG. 1. In particular, for example, FIGS. 4A to 4F illustrate hetero nanowires, which include at least two different kinds of elements.

Figure 4A:
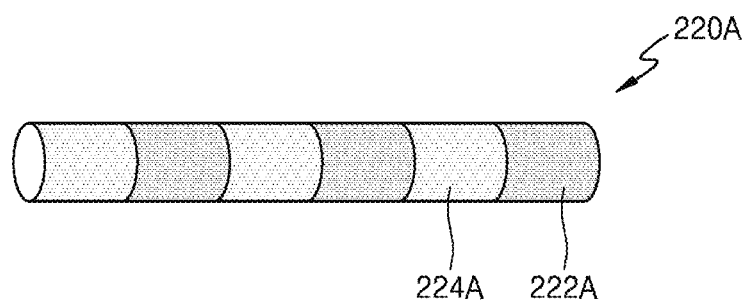
FIGS. 4A to 4F are perspective views of nanowires that may constitute a porous thin film of a pellicle according to an example embodiment.

Referring to FIG. 4A, the porous thin film 120 shown in FIG. 1 may include a hetero nanowire 220A including two kinds of materials. The nanowire 220A may include a structure in which first portions 222A includes a first material, and second portions 224A includes a second material. The first portions 222A and the second portions 224A are alternately arranged in a lengthwise direction of the nanowire 220A. The second material may be different from the second material.

In at least some example embodiments, the first portions 222A may include a different material from a material included in the second portions 224A of the nanowire 220A. Each of the first portions 222A and the second portions 224A may include a material selected from the group consisting of, including but not limited to, Si, C, Ni, Pt, Au, and Ru. That is, for example, the first portions 222A may include silicon (Si), and the second portion 224A may include carbon (C).

Figure 4B:
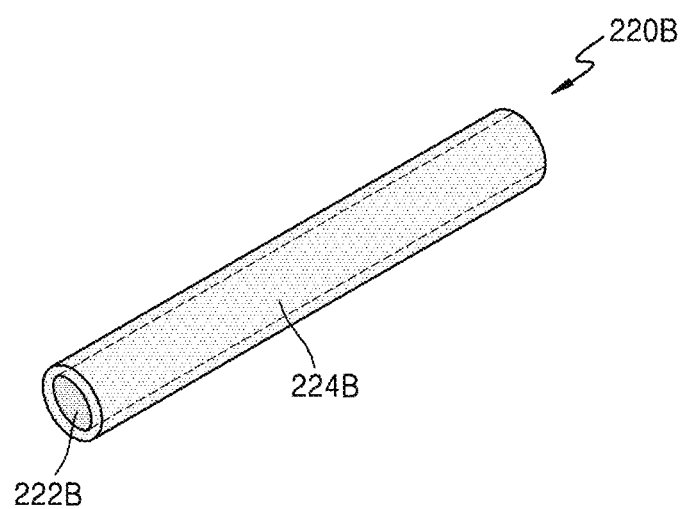

Referring to FIG. 4B, the porous thin film 120 shown in FIG. 1 may include a hetero nanowire 220B including two kinds of materials. The nanowire 220B may include a circular or elliptical core wire 222B, and a shell wire 224B. The circular or elliptical core wire 222B includes a first material, and the shell wire 224B includes a second material. The shell wire 224B surrounds the core wire 222B. The second material may be different from the first material.

In at least some example embodiments, each of the circular or elliptical core wire 222B and the shell wire 224B of the nanowire 220B may include a material selected from the group consisting of, including but not limited to, Si, C, Ni, Pt, Au, and Ru. That is, for example, the circular or elliptical core wire 222B may include silicon (Si), and the shell wire 224B may include carbon (C).

Figure 4C:
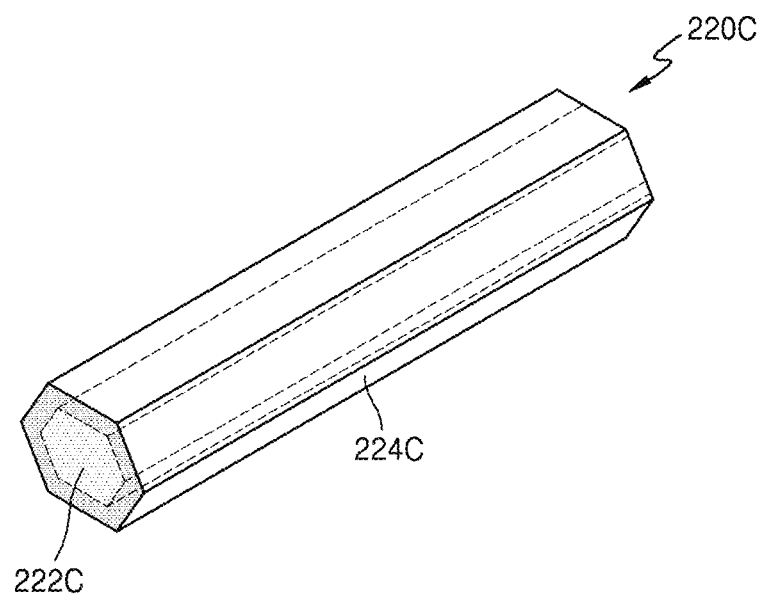

Referring to FIG. 4C, the porous thin film 120 shown in FIG. 1 may include a hetero nanowire 220C including two kinds of materials. The nanowire 220C may include a polygonal core wire 222C and a shell wire 224C. The core wire 222C may include a first material; and the shell wire 224C may include a second material. The shell wire 224C surrounds the core wire 222C. The second material may be different from the first material.

In at least some example embodiments, each of the core wire 222C and the shell wire 224C of the nanowire 220C may include a material selected from the group consisting of, including but not limited to, Si, C, Ni, Pt, Au, and Ru. That is, for example, the core wire 222C may include gallium nitride (GaN) doped with an n-type dopant, and the shell wire 224C may include gallium nitride (GaN) doped with a p-type dopant. Here, the n-type dopant may be phosphorus (P) and/or arsenic (As), whereas the p-type dopant may be boron (B).

Figure 4D:
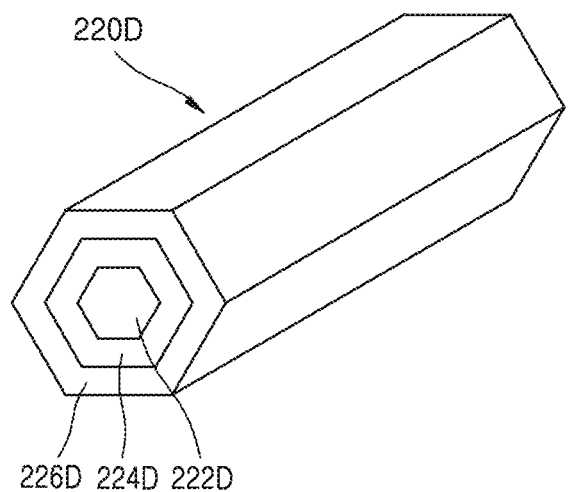
Figure 4E:
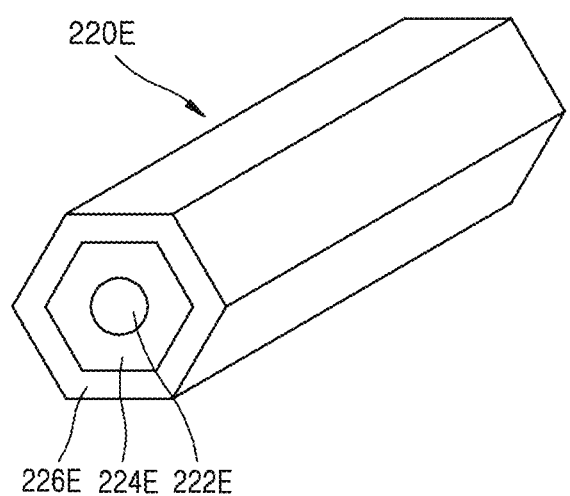
Figure 4F:
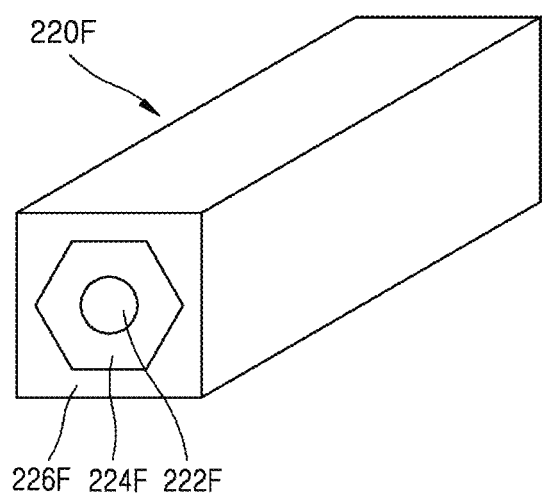

FIGS. 4D, 4E, and 4F illustrate nanowires 220D, 220E, and 220F having triple core-shell structures, respectively.

Referring to FIGS. 4D to 4F, the nanowires 220D, 220E, and 220F may include p-type core wires 222D, 222E, and 222F, respectively. The nanowires 220D, 220E, and 220F may further include intrinsic shell wires 224D, 224E, and 224F, which are configured to surround the p-type core wires 222D, 222E, and 222F, respectively. The nanowires 220D, 220E, and 220F may further include n-type shell wires 226D, 226E, and 226F, which are configured to surround the intrinsic shell wires 224D 224E, and 224F, respectively.

Referring to FIG. 4D, the nanowire 220D may include a hexagonal p-type core wire 222D, a hexagonal intrinsic shell wire 224D, and a hexagonal n-type shell wire 226D.

Referring to FIG. 4E, the nanowire 220E may include a circular or elliptical p-type core wire 222E, a hexagonal intrinsic shell wire 224E, and a hexagonal n-type shell wire 226E.

Referring to FIG. 4F, the nanowire 220F may include a circular or elliptical p-type core wire 222F, a hexagonal intrinsic shell wire 224F, and a tetragonal n-type shell wire 226F.

In at least some example embodiments, the nanowires 220D, 220E, and 220F may be formed of silicon (Si).

The nanowires NWA, NWB, NWC, NWD, NWE, NWF, NWG, and NWH shown in FIGS. 3A to 3H, the nanowire 220A, 220B, 220C, 220D, and 220F shown in FIGS. 4A to 4F, and nanowires having similar structures thereto may be synthesized by using various methods as discussed in the present application.

In at least some example embodiments, the plurality of nanowires may be synthesized by using, including but not limited to, a vapor particle growth method, a liquid growth method, a solid particle manufacturing method, a vapor-liquid-solid (VLS) growth method, or an oxide-assisted growth (OAG) method.

In at least some example embodiments, to synthesize a single-element nanowire, a chemical reaction for one-dimensional (1D) growth may be induced by using a 1D plate, such as a porous film or nanofibers. The 1D growth may be induced by using a metal catalyst, a laser, and/or a combination thereof. The 1D growth may be induced by using a vapor-liquid-solid (VLS) growth method, a solution-liquid-solid (SLS) growth method, and/or a vapor-solid (VL) growth method.

In an example of manufacturing two-dimensional (2D) silicon nanowires, a photoresist material may be patterned on a nanoscale level by using an e-beam lithography apparatus, and a silicon material may be etched on a nanoscale level by using the patterned photoresist as a mask.

In at least another example embodiment of the method of forming the plurality of nanowires, a VLS growth method may be performed. For example, a nanoscale metal catalyst may be formed, and the 2D silicon nanowires may be grown by injecting a reactive gas (e.g., $SiH_4$ (silane) gas) while maintaining a relatively high temperature of about 900° C. to about 1000° C.

Figure 3A:
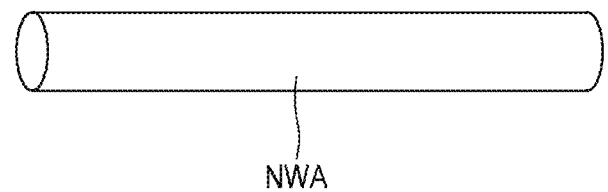
FIGS. 3A to 3H are perspective views of nanowires that may constitute a porous thin film of a pellicle according to an example embodiment.
Figure 3B:
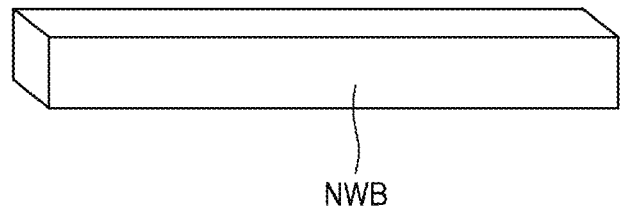
Figure 3C:
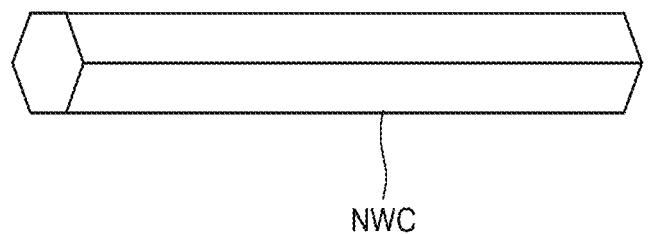
Figure 3D:
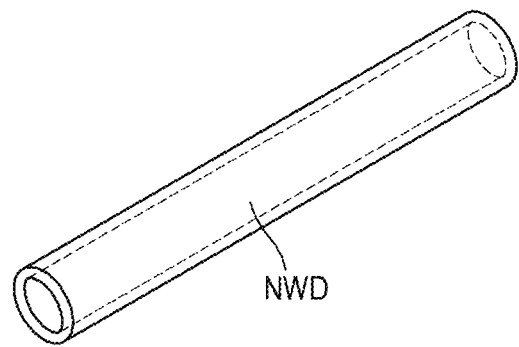
Figure 3E:
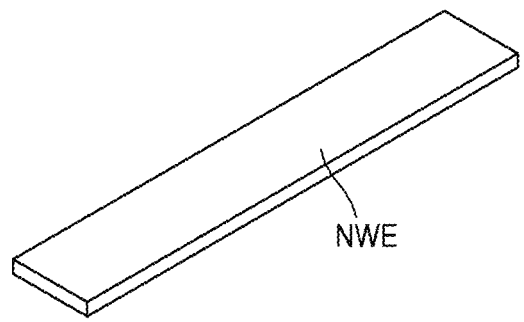
Figure 3F:
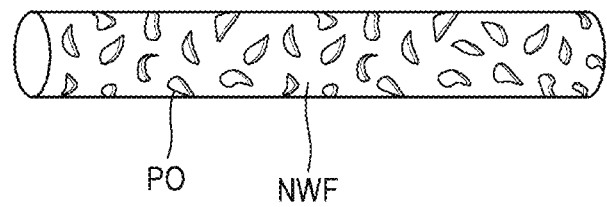
Figure 3G:
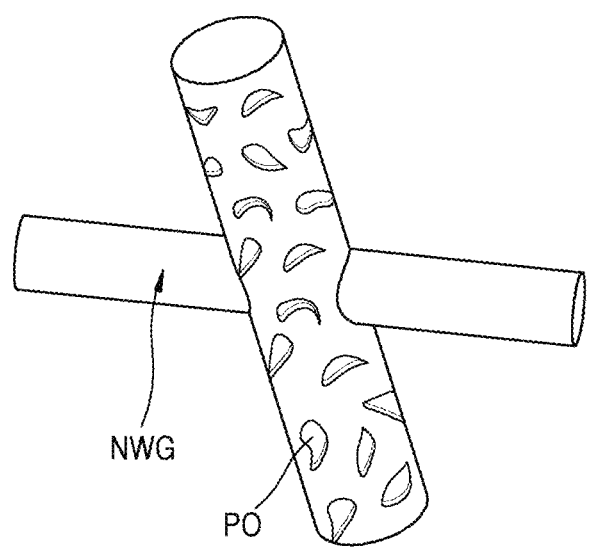
Figure 3H:
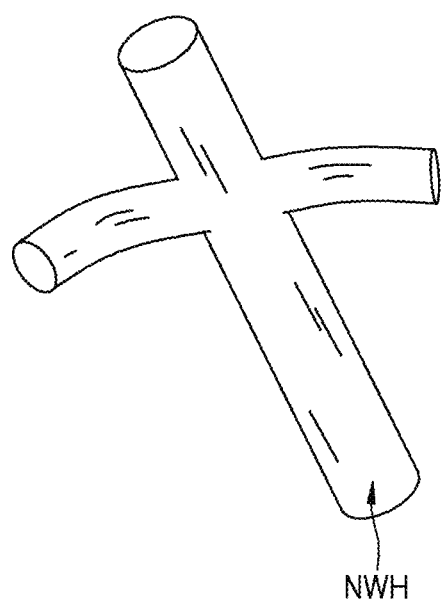

In an example of a method of forming a mesoporous nanowire NWF shown in FIG. 3F, a process of electrochemically etching a silicon substrate in a HF (hydrofluoric) water solution or an organic solution may be used.

In an another example embodiment of the method of forming the mesoporous nanowire NWF, a process of etching the silicon substrate in a HNO3/HF (nitric acid/hydrofluoric) solution may be used.

In an another example embodiment of the method of forming the mesoporous nanowire NWF, silver (Ag) particles, for example, may be formed as an etching catalyst on the surface of a silicon substrate by using a mixture of $AgNO_3$ (silver nitrate) and hydrofluoric (HF) acid, and the silicon substrate on which the silver particles are formed may be etched by using a solution mixture including $HF/H_2O_2/H_2O$ (hydrofluoric/hydrogen peroxide/water, respectively).

To manufacture a hetero nanowire including at least two elements as shown in FIGS. 4A to 4F, a VLS growth method of growing crystals on nanoparticles of a metal catalyst may be used. For example, the hetero nanowire may be synthesized by changing the kinds of precursor materials during a process of growing the nanowire. In this case, for example, when a newly changed precursor material grows through an interface between the growing nanowire and a catalyst, and is not adsorbed on the surface of the nanowire, the newly changed precursor material may grow in an axial direction of the nanowire. Thus, an axial hetero nanowire having a similar structure to the nanowire 220A, as shown in FIG. 4A, may be obtained. In at least another example embodiment, when the newly changed precursor material is easily adsorbed on the surface of the growing nanowire, the nanowires 220B, 220C, 220D, 220E, and 220F shown in FIGS. 4B to 4F, or a circumferential hetero nanowire having a similar structure, may be obtained.

In at least an example of a method of manufacturing a nanowire having a core-shell structure, a process of replacing the surface of a nanowire forming a core by a material for forming a shell may be used.

In at least an example of a process for manufacturing a nanowire including a core-shell structure, a metal nanowire dispersed solution formed by dispersing metal nanowires in a polar solvent, and a metal precursor solution formed by dissolving a metal precursor in a nonpolar solvent may be prepared, and the metal nanowire dispersed solution may be mixed with the metal precursor solution. The polar solvent may include at least one of, including but not limited to, water ($H_2O$), methanol ($CH_3OH$), ethanol ($C_2H_6O$), isopropanol ($C_3H_8O$), dimethyl sulfoxide ($C_2H_6OS$), methylene chloride ($CH_2Cl_2$), and tetrahydrotbran ($C_4H_8O$). The nonpolar solvent may include at least one of xylene ($C_8H_{10}$), toluene ($C_7H_8$), benzene ($C_6H_6$), and hexane ($C_6H_{14}$). The metal nanowire may include nickel (Ni), but is not limited thereto.

In at least some example embodiments, the core-shell structure including carbon nanotubes (CNTs)-silicon nanowires and/or the core-shell structure including silicon nanowire-CNTs may be formed by using a laser ablation process, a VLS synthesis process, an electroless etching process, a thermal chemical vapor deposition (CVD) process, and/or a combination thereof. That is, for example, a thermal CVD process may be performed for about five minutes at a reaction temperature of about 1100° C. while supplying hydrogen (H2) gas and CH4 (methane) gas to silicon nanowires. Thereafter, a synthesized nanocomposite may be thermally treated to remove an amorphous carbon layer and improve the crystallinity of the nanocomposite.

In at least some example embodiments, SiC (silicon carbide or carborundum) nanowires may be formed by using CNTs (carbon nanotubes) as a matrix and using SiH4 (silane) and $C_3H_8$ (propane) as main source gases. A metal catalyst may be formed on a silicon substrate, and the silicon substrate on which the metal catalyst is formed may be surface-processed by using $NH_3$ (ammonia). Afterwards, the CNTs may be grown by supplying a carbon source, for example, C2H2 (acetylene), at a temperature of about 700° C. Thereafter, the obtained resultant structure may be transferred to a radio-frequency (RF)-inductive CVD (chemical vapor deposition) system, hydrogen (H2) gas may be supplied to the RF-inductive CVD system, and the resultant structure may be surface-processed for about five minutes at a temperature of about 1000° C. so that the SiC nanowires may be grown.

Referring back to FIG. 1, an opening 150H formed in the center of the pellicle frame 150 may have a width 150 W of about 50 mm (millimeter) to about 150 mm. That is, for example, the opening 150H may have a square shape of about 50 mm×50 mm, a rectangular shape of about 50 mm×80 mm, and/or a rectangular shape of about 110 mm×140 mm, however, shape of the opening 150H is not limited to the foregoing dimensions.

The porous thin film 120 may have a sufficient large size to completely cover the opening 150H. That is, for example, the porous thin film 120 may have a larger planar size than a planar size of the opening 150H. For example, the porous thin film 120 may have a planar size of about 60 mm×60 mm, about 60 mm×90 mm, and/or about 120 mm 150 mm; however, the configuration of the porous thin film 120 is not limited to the foregoing dimensions.

According to example embodiments of inventive concepts, a planar shape of the opening 150H formed in the center of the pellicle frame 150 is not limited to a tetragonal shape and/or a rectangular shape. The pellicle frame 150 including various planar shape configurations may be used according to a shape and structure of a photomask substrate. That is, for example, a planar shape of the opening 150H may have various shape configurations, such as, including but not limited to, a triangular shape, a tetragonal shape, a hexagonal shape, or an octagonal shape. Thus, the pellicle frame 150 may also have various shape configurations (e.g., a triangular shape, a tetragonal shape, a hexagonal shape, and/or an octagonal shape) corresponding to the planar shape of the opening 150H of the pellicle frame 150.

In at least some example embodiments, the pellicle frame 150 may include a metal and/or a polymer. For example, the pellicle frame 150 may include but not limited to, carbon, diamond-like carbon (DLC), aluminum, stainless steel, and/ or polyethylene; however, inventive concepts are not limited to the foregoing metals and/or polymers.

In at least some example embodiments, the adhesive layer 160 may include an adhesive, such as, including but not limited to, acryl resin, epoxy resin, and/or fluorine resin; however, inventive concepts with respect to the types of adhesives that the adhesive layer may include is not limited thereto.

In at least some example embodiments, the porous thin film 120 may be manually adhered to the pellicle frame 150 by using the adhesive layer 160. In at least some other example embodiments, a process of adhering the porous thin film 120 to the pellicle frame 150 may be performed by an automation process using a machine.

As described above, in the pellicle 100, according to example embodiments, the porous thin film 120 may include a plurality of nanowires arranged across one another to form a net-like structure. Thus, the porous Min film 120 may ensure a relatively large thickness sufficient for structural stability and provide a relatively low optical density. As a result, out-of-band (OoB) reflectance of light having a wavelength of, for example, at or about 140 nm (nanometer) to at or about 300 nm, other than that of EUV light or e-beams having a wavelength of about 6.75 nm to about 13.5 nm, may be reduced, and resolution may be improved. Also, since the pellicle membrane 140 includes the porous thin film 120, which includes a plurality of nanowires arranged across one another to form a net-like structure, thermal damage due to an exposure process may be limited and/or prevented, and it may not be necessary to form an additional vent hole for outgassing in the pellicle frame 150. Accordingly, with respect to example embodiments of inventive concepts, the manufacture of the pellicle 100 may be simple and easy, and haze defects may be limited and/or prevented from occurring in the surface of a photomask during the exposure process.

Figure 5:
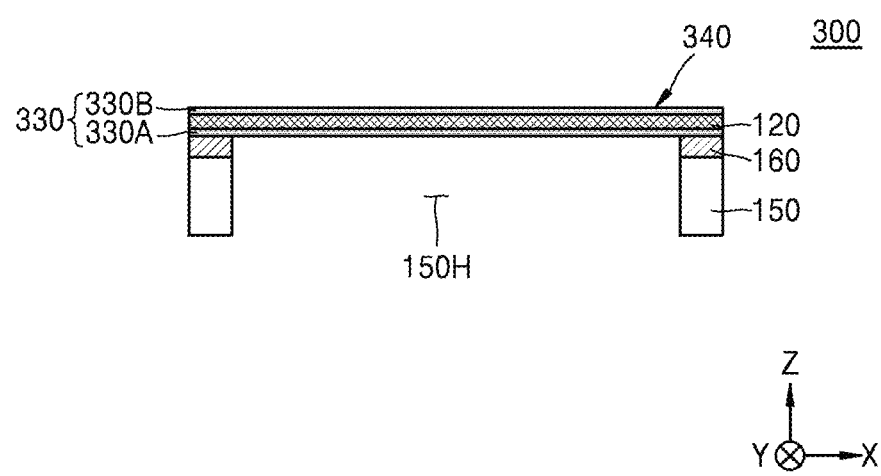
FIG. 5 is a cross-sectional view of a pellicle according to an example embodiment.

FIG. 5 is a cross-sectional view of a pellicle 300 according to an example embodiment. In FIG. 5, the same reference numerals are used to denote the same elements as in FIG. 1, and detailed descriptions thereof are omitted.

Referring to FIG. 5, the pellicle 300 may include a porous thin film 120 and a pellicle membrane 340. The pellicle membrane 340 includes a capping layer 330, which covers at least one side surface of the porous thin film 120. FIG. 5 illustrates an example embodiment in which the capping layer 330 includes first and second capping layers 330A and 330B covering both side surfaces of the porous thin film 120; however, inventive concepts are not limited to the foregoing structural configuration. When necessary, the pellicle 300 may include only the first capping layer 330A, which covers a surface of the porous thin film 120 facing the pellicle frame 150, and/or include only the second capping layer 330B, which covers another surface of the porous thin film 120. The second capping layer 330B is the reverse side of the surface of the porous thin film 120 facing the pellicle frame 150.

The capping layer 330 may include a different material from a material included in the porous thin film 120. In some example embodiments, the capping layer 330 may include a material selected from the group consisting of, including but not limited to, silicon carbide (SiC), silicon dioxide ($SiO_2$), silicon nitride ($Si_3N_4$), silicon oxynitride (SiON), yttrium oxide ($Y_2O_3$), yttrium nitride (YIN), barium carbide ($BaC_2$), barium nitride ($Ba(NO_3)_2$), molybdenum (Mo), ruthenium (Ru), rhodium (Rh), and a combination thereof.

The pellicle frame 150 may be adhered to the capping layer 330 by an adhesive layer 160. The pellicle membrane 340 may be evenly maintained on the pellicle frame 150 to have a free-standing structure.

Figure 6:
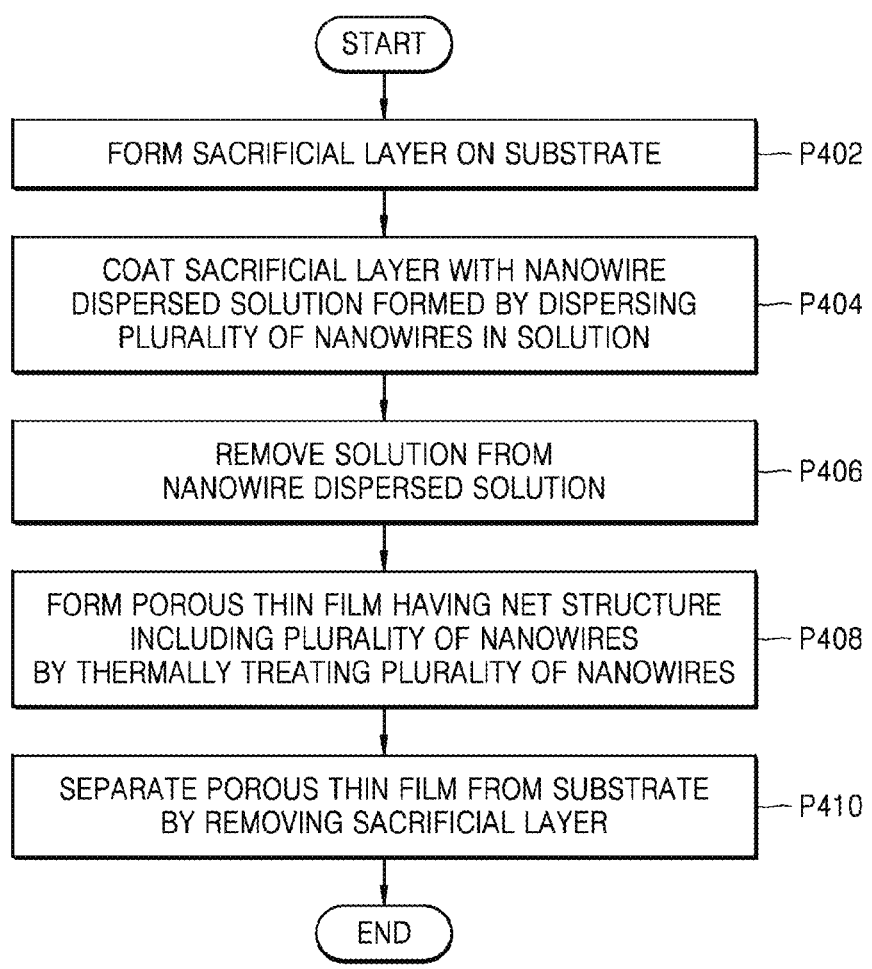
FIG. 6 is a flowchart of an example of a method of manufacturing a pellicle membrane that may be included in a pellicle according to an example embodiment.

FIG. 6 is a flowchart of an example of a method of manufacturing a pellicle membrane that may be included in a pellicle according to an example embodiment.

FIGS. 7A to 7E are cross-sectional views of process operations of a method of forming a pellicle membrane by using the method shown in FIG. 6.

Figure 7A:
FIGS. 7A to 7E are cross-sectional views of process operations of a method of manufacturing a pellicle membrane by using a method of manufacturing a pellicle membrane that may be included in a pellicle according to an example embodiment.

Referring to FIGS. 6 and 7A, at P402, a sacrificial layer 504 may be formed on a substrate 502.

A material of the substrate 502 may be used without any particular limitation when the material of the substrate 502 has an etch selectivity with respect to the sacrificial layer 504 in an etching atmosphere for removing the sacrificial layer 504. That is, for example, the substrate 502 may include a silicon substrate; however, inventive concepts are not limited to the foregoing feature with respect to the substrate 502.

The sacrificial layer 504 may include but not limited to, a photoresist material, a polymer, nickel (Ni) foil, copper (Cu) foil, and/or nickel/copper (Ni/Cu) foil.

Figure 7B:
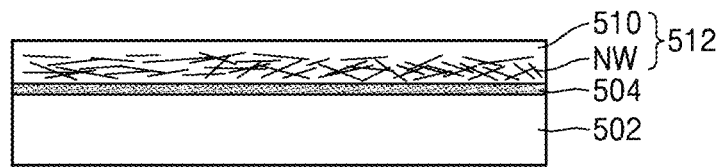

Referring to FIGS. 6 and 7B, at P404, a nanowire dispersed solution 512 formed by dispersing a plurality of nanowires NW in a solvent 510 may be coated on the sacrificial layer 504.

The nanowire dispersed solution 512 may be, for example, coated on the sacrificial layer 504 by using a spin coating process.

In at least some example embodiments, the solvent 510 that forms the nanowire dispersed solution 512 may be deionized water (DIW), an organic solvent, an aqueous solvent, and/or a combination thereof. In at least some example embodiments, the solvent 510 may include a mixture of DIW and an organic solvent. In at least some example embodiments, the solvent 510 may include water; alcohols, such as; including, but not limited to; methanol, methanol, ethanol, isopropanol, propanol, butanol, and/or terpineol; amides; such as, including, but not limited to, dimethylformamide ($C_3H_7NO$) and dimethylacetamide; pyrrolidones, such as, including but not limited to, N-methyl-2-pyrrolidone and N-ethylpyrrolidone; hydroxy esters, such as, including but not limited to, dimethyl sulfoxide, γ-butyrolactone, methyl lactate, ethyl lactate, β-methoxy isobutyric acid methyl, α-hydroxy isobutyric acid methyl; organic halides, such as, including but not limited to, dichloroethane, dichlorobenzene, and trichloroethane; nitro compounds, such as, including but not limited to, nitromethane and nitroethane; and nitrile compounds, such as, including but not limited to, acetonitrile and benzonitrile; and/or a combination thereof.

The plurality of nanowires NW may have at least one structure selected from the group consisting of nanowires NWA, NWB, NWC, NWD, NWE, NWF, NWG, and NWH as shown in FIGS. 3A to 3H, the hetero nanowires 220A, 220B, 220C, 220D, 220E, and 220F as shown in FIGS. 4A to 4F, and various nanowires that are modified and changed within the scope of example embodiments of inventive concepts.

Figure 7C:

Referring to FIGS. 6 and 7C, at P406, the solvent 510, for example, may be removed from the nanowire dispersed solution 512.

The removal of the solvent 510 may include heating the solvent 510, and/or leaving the solvent 510 to sit until the solvent 510 is volatilized and/or evaporated. In at least some example embodiments, an annealing process for removing the solvent 510 may be performed at a temperature of about 750° C. to about 1100° C., but inventive concepts are not limited to the foregoing features recited in this paragraph.

In at least some example embodiments, the operation of removing the solvent 510 by using the process at P406 may be omitted.

Figure 7D:
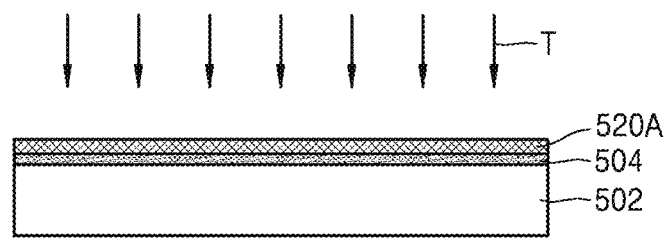

Referring to FIGS. 6 and 7D, at P408, the plurality of nanowires NW may be thermally treated (T) to form a porous thin film 520A having a net-like structure including the plurality of nanowires NW.

In at least some example embodiments, the thermal treatment (T) of the plurality of nanowires NW may be performed at a temperature of about 750° C. to about 1100° C.; however, inventive concepts are not limited to the foregoing features recited in this paragraph.

When the operation of removing the solvent 510 by using the process at P406 is omitted, the solvent 510 (refer to FIG. 7B) may be removed during the thermal treatment T using the process at P408. Also, among the plurality of nanowires NW (refer to FIGS. 7B and 7C), nanowires NW that are adjacent to one another may be unified during a thermal treatment process due to the process at P408. Thus, the porous thin film 520A including a plurality of nanowires NW that are unified to form a net structure may be formed.

The plurality of nanowires NW included in the porous thin film 520A formed on the sacrificial layer 504 may be arranged across one another to form a net-like structure as shown in FIG. 2A or FIG. 2B.

Figure 7E:

Referring to FIGS. 6 and 7E, at P410, the porous thin film 520A may be separated from the substrate 502 by removing the sacrificial layer 504.

When the sacrificial layer 504 includes a photoresist material or a polymer, for example, the sacrificial layer 504 may be wet removed by using a solution capable of selectively removing the sacrificial layer 504, such as, including but not limited to, a developing solution or an organic solvent. When the sacrificial layer 504 includes nickel (Ni) foil, copper (Cu) foil, or nickel/copper (Ni/Cu) foil, the sacrificial layer 504 may be removed by using an etchant. That is, for example, an iron III chloride ($FeCl_3$) water solution, an ammonium persulfate (($NH_4)_2S_2O_8$) water solution, or a eerie ammonium nitrate (($H_8N_8CeO_{18}$) water solution may be used as the etchant; however, inventive concepts are not limited the foregoing features recited in this paragraph.

In at least some example embodiments, the porous thin film 520A may be separated from the substrate 502 by removing the sacrificial layer 504. Thereafter, metal impurities remaining in the porous thin film 520A may be removed by using an etchant and rinsed by using an organic solvent (e.g., acetone) or deionized water (DIW). In at least some example embodiments, the etchant for removing the metal impurities may include, but not limited to, hydrochloric acid, nitric acid, sulfuric acid, acetic acid, hydrofluoric acid, royal water, and/or a combination thereof, but a kind of the etchant is not limited thereto.

After the porous thin film 520A is separated from the substrate 502, the porous thin film 520A may be transferred by using a transfer film (not shown), and a subsequent process for completing formation of a pellicle according to an example embodiment may be performed.

To manufacture the pellicle 100, as shown in FIG. 1, the pellicle frame 150 may be adhered to one surface of the porous thin film 520A by using the adhesive layer 160.

Figure 8:
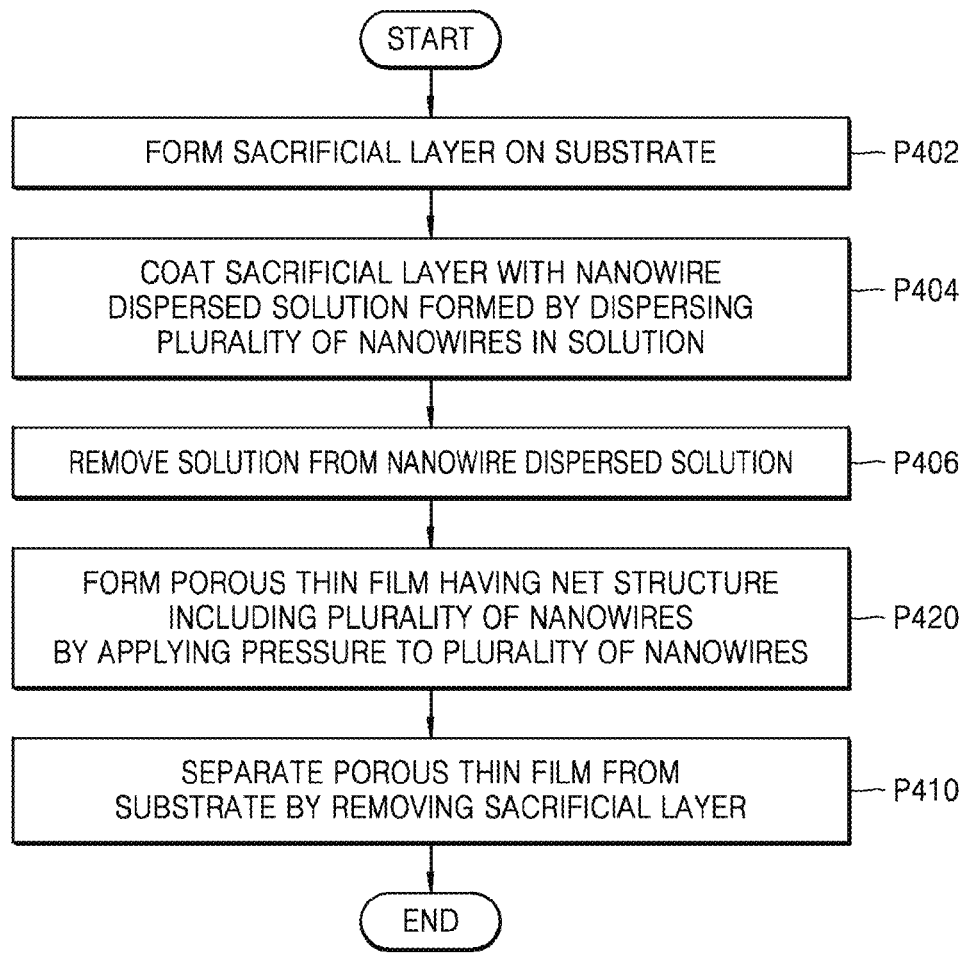
FIG. 8 is a flowchart of another example of a method of manufacturing a pellicle membrane that may be included in a pellicle according to an example embodiment.

FIG. 8 is a flowchart of another example of a method of forming a pellicle membrane that may be included in a pellicle according to an example embodiment.

Figure 9A:
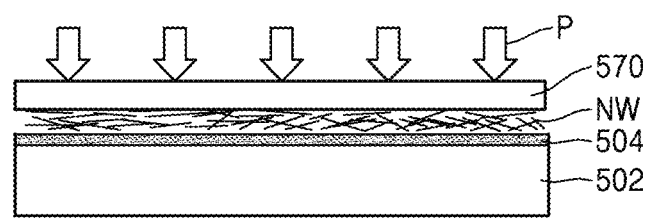
FIGS. 9A and 9B are cross-sectional views of process operations of a method of forming a pellicle membrane by using a method of manufacturing a pellicle membrane that may be included in a pellicle according to an example embodiment.
Figure 9B:
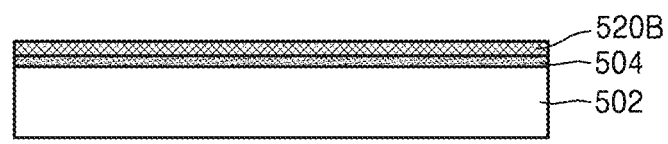

FIGS. 9A and 9B are cross-sectional views of process operations of a method of forming a pellicle membrane by using the method shown in FIG. 8.

The method of forming the pellicle membrane will now be described with reference to FIGS. 8, 9A, and 9B, in this case, the same reference numerals are used to denote the same elements as in FIGS. 6 and 7A to 7E, and repeated descriptions of the same elements are omitted.

Referring to FIGS. 8 and 9A, processes may be performed as described with reference to the processes from P402 to P406 of FIG. 6, and FIGS. 7A to 7C. Thus, after a process of removing the solvent 510 from the nanowire dispersed solution 512, in a process at P420, pressure P may be applied to the plurality of nanowires NW remaining on the sacrificial layer 504, such that adjacent ones of the plurality of nanowires NW may be adhered under pressure to one another.

The pressure P may be applied in a thickness direction of the substrate 502. A pressing member 570 may be used to apply the pressure P to the plurality of nanowires NW. A material of the pressing member 570 may be used without any particular limitation when the pressing member 570 is capable of transmitting externally applied pressure P to the plurality of nanowires NW.

As the result of the application of the pressure P to the plurality of nanowires NW, as shown in FIG. 9B, a porous thin film 520B including the plurality of nanowires NW that are adhered under pressure to one another to form a net-like structure may be formed.

The plurality of nanowires NW included in the porous thin film 520B formed on the sacrificial layer 504, for example, may be arranged across one another to form a net-like structure as shown in FIG. 2A or FIG. 2B.

Thereafter, the porous thin film 520B may be separated from the substrate 502 by removing the sacrificial layer 504 by using the process at P410 of FIG. 6 and the method described with reference to FIG. 7E. Afterwards, to manufacture the pellicle 100 shown in FIG. 1 the pellicle frame 150 may be adhered to one surface of the porous thin film 520B by using an adhesive layer 160.

Figure 10:
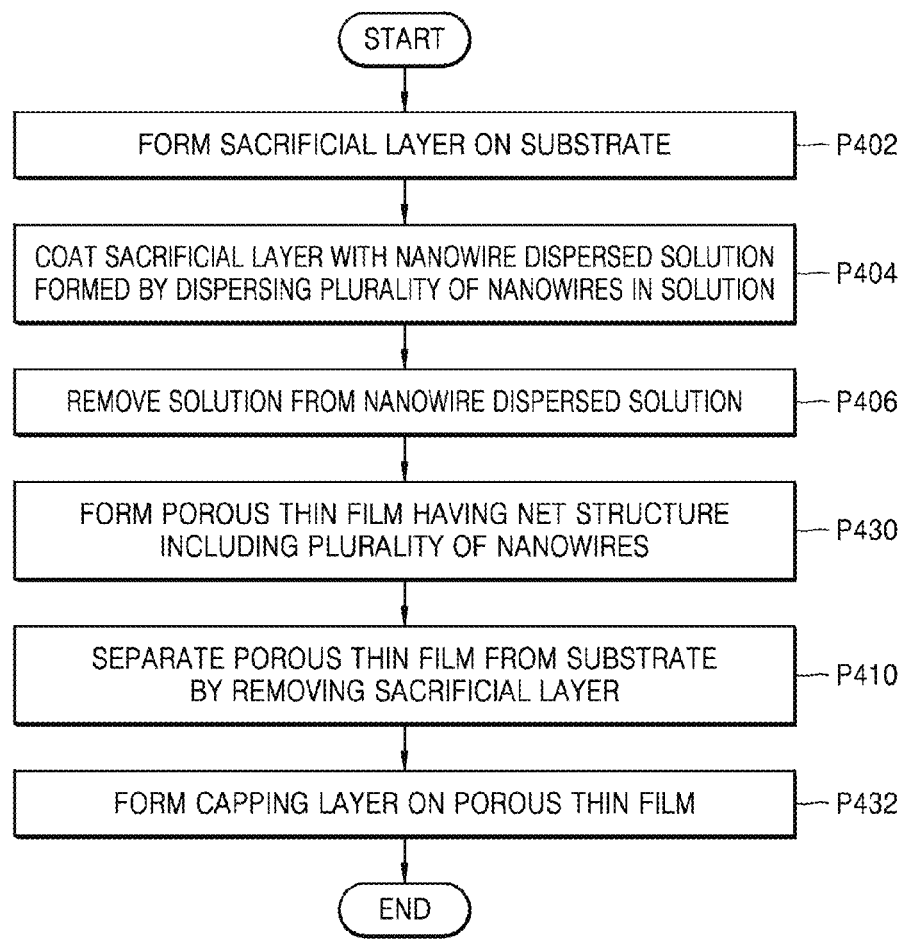
FIG. 10 is a flowchart of another example of a method of manufacturing a pellicle membrane that may be included in a pellicle according to an example embodiment.

FIG. 10 is a flowchart of another example of a method of manufacturing a pellicle membrane that may be included in a pellicle according to an example embodiment.

Figure 11:
FIG. 11 is a cross-sectional view of a method of forming a pellicle membrane by using a method of manufacturing a pellicle membrane that may be included in a pellicle according to an example embodiment.

FIG. 11 is a cross-sectional view of an example of a method of forming a pellicle membrane by using the method shown in FIG. 10.

The method of forming the pellicle membrane will now be described with reference to FIGS. 10 and 11. In this case, the same reference numerals are used to denote the same elements as in FIGS. 1 to 9B, and repeated descriptions thereof are omitted.

Referring to FIGS. 10 and 11, processes may be performed as described above with reference to the processes from P402 to P406 of FIG. 6 and FIGS. 7A to 7C. Thus, after a process of removing the solvent 510 from the nanowire dispersed solution 512 is performed, in a process at P430, a porous thin film 520C including a plurality of nanowires NW may be formed.

The porous thin film 520C may be formed by using the process at P408 of FIG. 6 or the process at P420 of FIG. 8.

Thereafter, in a process at P410, the porous thin film 520C may be separated from the substrate 502 by removing the sacrificial layer 504. Next, in a process at P432, a capping layer 330 may be formed on at least one surface of the porous thin film 520C.

FIG. 11 illustrates an example embodiment in which the capping layer 330 includes first and second capping layers 330A and 330B, which cover both surfaces of the porous thin film 520C; however, inventive concepts are not limited to the example shown in FIG. 11. When necessary, only one of the first capping layer 330A and the second capping layer 330B may be formed.

Thereafter, the pellicle 300 shown in FIG. 5, for example, may be manufactured by using the porous thin film 520C covered with the capping layer 330. To this end, the pellicle frame 150 may be adhered onto the capping layer 330 by using the adhesive layer 160.

FIGS. 12A to 12E are cross-sectional views of process operations of a method of forming a pellicle membrane that may be included in a pellicle according to an example embodiment. In FIGS. 12A to 12E, the same reference numerals are used to denote the same elements as in FIGS. 1 to 11, and repeated descriptions thereof are omitted.

Figure 12A:
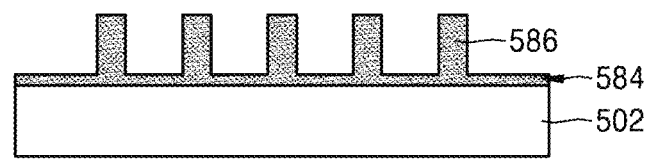
FIGS. 12A to 12E are cross-sectional views of process operations of a method of forming a pellicle membrane that may be included in a pellicle according to an example embodiment.
Figure 12B:
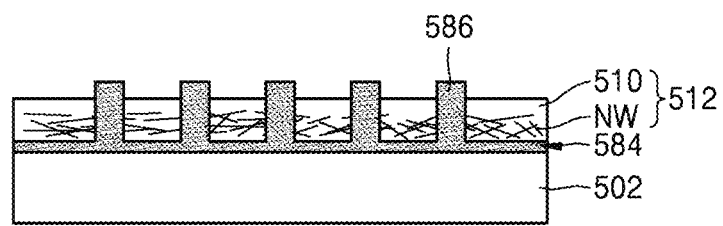

Referring to FIG. 12A, a sacrificial guide pattern 584 may be formed on a substrate 502.

The sacrificial guide pattern 584 may have substantially similar configuration as the sacrificial layer 504 described with reference to FIG. 7A, except that the sacrificial guide pattern 584 includes a plurality of guide pillars 586 that protrude upward, and are regularly arranged. The plurality of guide pillars 586 may be arranged to correspond to the plurality of spaces SP1 and SP2 described with reference to FIGS. 2C and 2I).

Referring to FIG. 1213, as described with reference to FIG. 7B, a nanowire dispersed solution 512 formed by dispersing a plurality of nanowires NW in a solvent 510, for example, may be coated on the sacrificial guide pattern 584.

A spin coating process, for example, may be used to coat the nanowire dispersed solution 512 on the sacrificial guide pattern 584. The nanowire dispersed solution 512 may be coated with the nanowire dispersed solution 512 to have a height lower than the height of the plurality of guide pillars 586 formed on the sacrificial guide pattern 584.

Figure 12C:
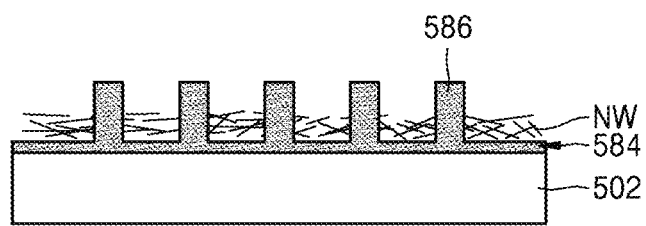

Referring to FIG. 12C, the solvent 510 may be removed from the nanowire dispersed solution 512 in the same manner as described with reference to FIG. 7C.

Figure 12D:
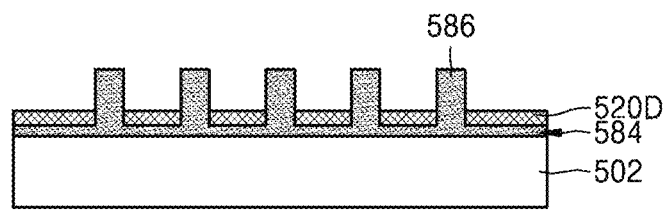

Referring to FIG. 12D, the plurality of nanowires NW may be thermally treated in a similar manner to that described with reference to FIG. 7B. Alternatively, pressure may be applied to the plurality of nanowires NW remaining on the sacrificial guide pattern 584 in a similar manner to that described with reference to FIG. 9A. Thus, a porous thin film 520D having a net-like structure including the plurality of nanowires NW may be formed.

The porous thin film 520D may have a similar configuration to the porous thin film 120C shown in FIG. 2C or the porous thin film 120D shown in FIG. 2D.

Figure 12E:

Referring to FIG. 12E, the sacrificial guide pattern 584 may be removed from the resultant structure of FIG. 12D by using the same method as the method of removing the sacrificial layer 504 described with reference to FIG. 7E so that the porous thin film 520D may be separated from the substrate 502.

Thereafter, metal impurities remaining in the porous thin film 520D may be removed by using an etchant and rinsed by using an organic solvent (e.g., acetone) or deionized water (DIW).

After the porous thin film 520D is separated from the substrate 502, the porous thin film 520D may be transferred by using a transfer film (not shown), and a subsequent process for completing formation of a pellicle according to example embodiments. In some example embodiments, similar to the processes of manufacturing the pellicles 100 and 300 shown in FIGS. 1 and 5, a pellicle frame 150 may be adhered to one surface of the porous thin film 520D by using an adhesive layer 160, thereby manufacturing a pellicle including the porous thin film 520D.

Figure 13:
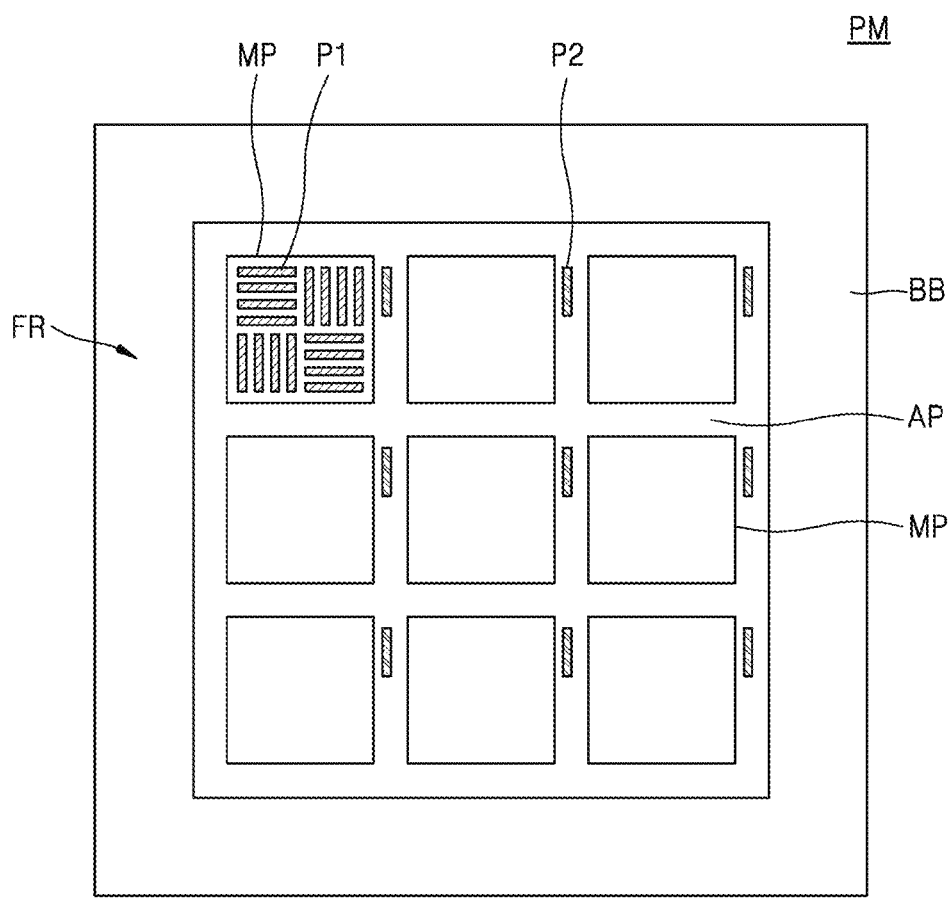
FIG. 13 is a schematic plan view of an example of a photomask that may be combined with a pellicle according to an example embodiment.

FIG. 13 is a schematic plan view of an example of a photomask PM that may be combined with a pellicle according to an example embodiment.

The photomask PM shown in FIG. 13 may be a reflective photomask configured to transfer a pattern onto wafers (not shown) by using an exposure process and manufacture integrated circuit (IC) devices (e.g., semiconductor devices). In some example embodiments, the photomask PM may be a reflective photomask based on a multi-mirror structure, which is used for a photolithography process using an EUV wavelength range, for example, an exposure wavelength of about 13.5 nm A front side surface FR of the photomask PM may include, for example, a main pattern region MP, which is configured to transfer a main pattern desired for forming a unit device constituting an IC to a chip region of the wafer. The front side surface FR may further include an auxiliary pattern region AP, which is configured to transfer an auxiliary pattern to a scribe lane region of the wafer, and a black border region BB surrounding the main pattern region MP and the auxiliary pattern region AP.

Main pattern elements P1 may be formed in the main pattern regions MP. The main pattern elements P1 may constitute a main pattern configured to transfer a pattern desired for forming the IC to the chip region of the wafer.

An auxiliary pattern, instead of a pattern constituting a desired IC, may be formed in the auxiliary pattern region AP. The auxiliary pattern may be desired for a process of manufacturing the IC but may not remain in a final IC. That is, for example, the auxiliary pattern may include auxiliary pattern elements P2, which are configured to transfer an alignment key pattern to a scribe lane region of the wafer.

The black border region BB may be a non-pattern region that is free from a pattern element for transferring a pattern onto wafer.

Figure 14:
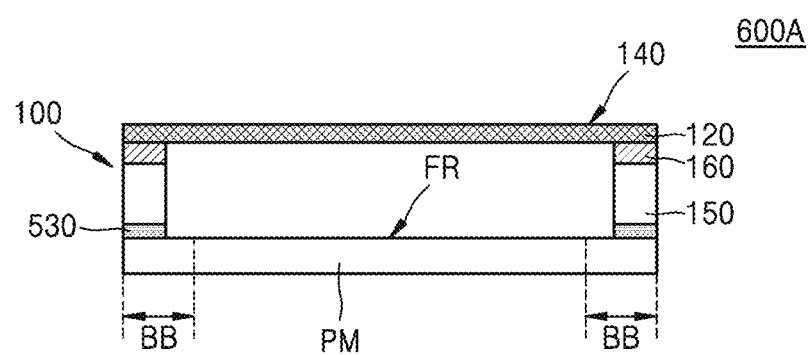
FIG. 14 is a cross-sectional view of a photomask assembly according to an example embodiment.

FIG. 14 is a cross-sectional view of a photomask assembly 600A according to an example embodiment.

Referring to FIG. 14, the photomask assembly 600A may include a photomask PM and a pellicle 100. The pellicle 100 is fixed to a black border region BB on a front surface FR of the photomask PM.

To fix the pellicle 100 to the black border region BB of the photomask PM, an adhesive layer 530 may be interposed between a surface of the pellicle frame 150 of the pellicle 100, which is opposite a surface of the pellicle frame 150 to which the pellicle membrane 140 is adhered, and the black border region BB of the photomask PM.

The pellicle frame 150 may have one end fixed to the pellicle membrane 140 by an adhesive layer 160 to support the pellicle membrane 140, and the other end fixed to the surface of the photomask PM by the adhesive layer 530.

Detailed descriptions of the pellicle 100 may be inferred from the descriptions provided with reference to FIG. 1.

In at least some example embodiments, the adhesive layer 530 may include but not limited to, silicone resin, fluorine resin, acryl resin, or poly(styrene-ethylene-butadiene-styrene)-based resin; however, inventive concepts are not limited to the foregoing features recited in this paragraph.

Figure 15:
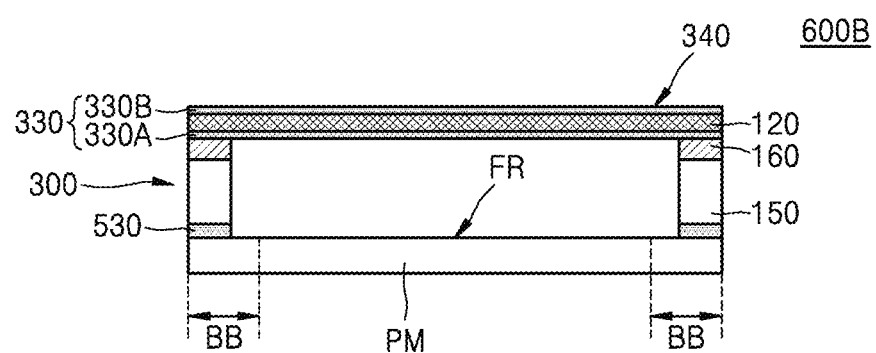
FIG. 15 is a cross-sectional view of a photomask assembly according to an example embodiment.

FIG. 15 is a cross-sectional view of a photomask assembly 600B according to other an example embodiment.

Referring to FIG. 15, the photomask assembly 600B may include, for example, a photomask PM and a pellicle 300 fixed to a black border region BB on a front side surface FR of the photomask PM. Detailed descriptions of the pellicle 300 may be inferred from the descriptions provided with reference to FIG. 5.

To fix the pellicle 300 to the black border region BB of the photomask PM, an adhesive layer 530 may be interposed between an opposite surface to a surface of a pellicle frame 150 to which the pellicle membrane 340 is adhered, and the black border region BB of the photomask PM.

FIGS. 14 and 15 illustrate cases in which each of the photomask assemblies 600A and 600B shown in FIGS. 14 and 15 includes a reflective photomask PM used for a photolithography process using an exposure wavelength of about 13.5 nm as shown in FIG. 13; however inventive concepts are not limited thereto. For example, including but not limited to, a transmissive photomask, for example, a photomask used for an exposure process using a KrF (krypton fluoride) excimer laser (248 nm), an ArF (argon fluoride) excimer laser (193 nm), or a fluorine (F2) excimer laser (157 nm) may be employed instead of the reflective photomask PM.

Figure 16:
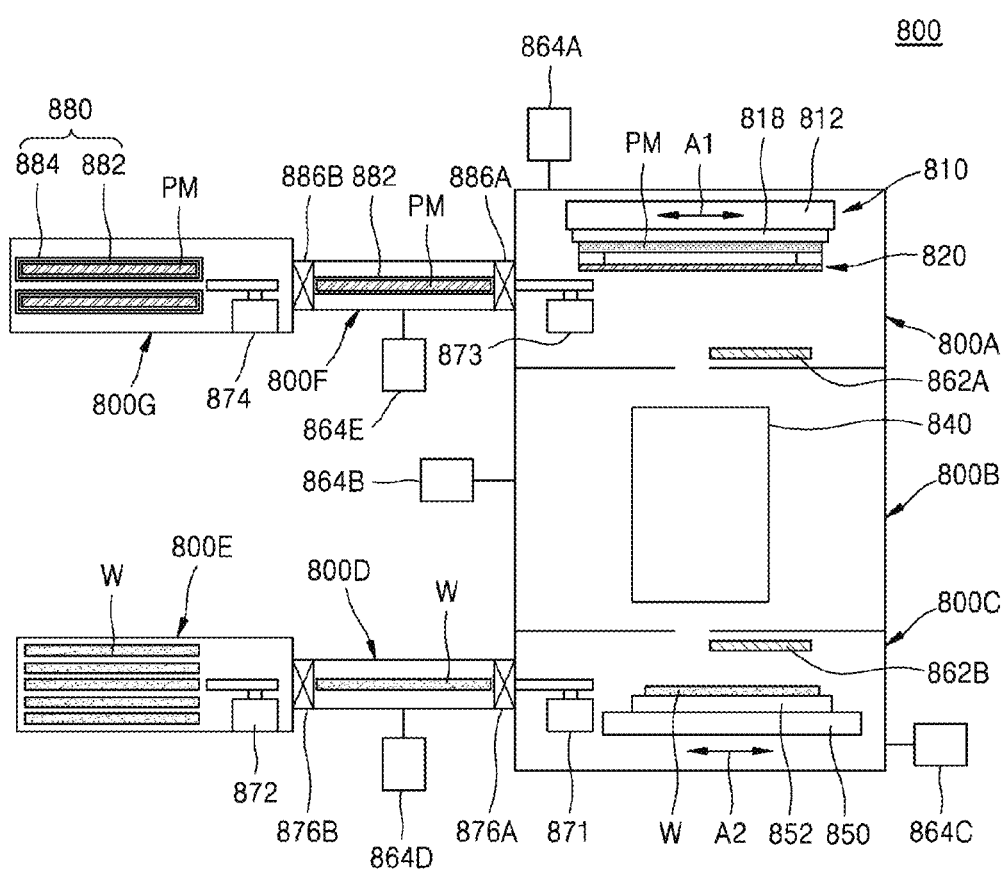
FIG. 16 is a schematic cross-sectional view of configuration of an integrated circuit (IC) device manufacturing apparatus according to an example embodiment.

FIG. 16 is a schematic cross-sectional view of configuration of an IC device manufacturing apparatus 800 according to an example embodiment. FIG. 16 illustrates the IC device manufacturing apparatus 800 including an exposure apparatus configured to reduce and transcribe an image of a pattern formed on a photomask (or referred to as a "reticle") to a wafer in a projection optical system in a vacuum by using EUV light.

Referring to FIG. 16, the IC device manufacturing apparatus 800 may include a mask stage region 800A, a projection optical system region 800B, and a wafer stage region 800C.

A mask stage 810 included in the mask stage region 800A may include a mask stage support structure 812 and a mask holder system 818 fixed to the mask stage support structure 812. The mask holder system 818 may serve to fix a photomask PM. In some example embodiments, the mask holder system 818 may include an electrostatic chuck, and the mask holder system 818 may adsorb and maintain the photomask PM due to electromagnetic force.

A pellicle 820 may be fixed onto the photomask PM. The pellicle 820 may include one of the pellicles 100 and 300 described with reference to FIGS. 1 and 5, or pellicles that are modified and changed within the scope of inventive concepts.

The mask stage 810 may be supported by the mask stage support structure 812 and move the fixed photomask PM in a scan direction indicated by an arrow A1. A projection optical system 840 may be located in the projection optical system region 800B and configured to transfer a pattern formed on the photomask PM to a wafer W in the wafer stage region 800C. The wafer W may be fixed to a wafer chuck 852 on a wafer stage 850. The wafer chuck 852 may move the wafer W in a scan direction indicated by an arrow A2.

The mask stage region 800A including the mask stage 810, the projection optical system region 800B including the projection optical system 840, and the wafer stage region 800C including the wafer stage 850 may be separated from one another by gate valves 862A and 862B. Vacuum exhaust systems 864A, 864B, and 864C may be connected to the mask stage region 800A, the projection optical system region 800B, and the wafer stage region 800C, respectively, and independently control pressures.

A transfer hand 871 may be installed between the wafer stage region 800C and a loadlock chamber 800D to load or unload the wafer W. A vacuum exhaust system 864D may be connected to the loadlock chamber 800D. The wafer W may be temporarily kept in a wafer load port 800E under an atmospheric pressure. A transfer hand 872 may be installed between the loadlock chamber 800D and a wafer load port 800E to load and/or unload the wafer W. A gate valve 876A may be interposed between the wafer stage space 800C and the loadlock chamber 800D. A gate valve 876B may be interposed between the loadlock chamber 800D and a wafer load port 800E.

A transfer hand 873 may be installed between the mask stage 810 of the mask stage region 800A and a mask loadlock chamber 800F to load and/or unload the photomask PM. A vacuum exhaust system 864E may be connected to the mask loadlock chamber 800F. The photomask PM may be temporarily kept in a mask load port 800G under an atmospheric pressure. A transfer hand 874 may be installed between the mask loadlock chamber 800F and a mask load port 800G to load and/or unload the photomask PM. A gate valve 886A may be inserted between the mask stage region 800A and the mask loadlock chamber 800F. A gate valve 886B may be inserted between the mask loadlock chamber 800F and a mask load port 800G.

The photomask PM may be contained in a photomask carrier 880 and transported from the outside to the IC device manufacturing apparatus 800. Also, the photomask PM may be contained in the photomask carrier 880 and transported to the mask load port 800G. Thus, the photomask PM may be effectively limited and/or prevented from being in an unnecessary contact with the external environment and contaminated by external particles.

The photomask carrier 880 may include an inner pod 882 and an outer pod 884 configured to provide a space containing the inner pod 882. Each of the inner pod 882 and the outer pod 884 may be a standard mechanical interface (SMIF) pod based on a standard (SEMI standard E152-0709). The outer pod 884 may be referred to as a "reticle SMIF pod". When the photomask PM is transferred between different fabrication stations, and/or between different locations, the outer pod 884 may serve to protect the photomask PM. The inner pod 882 may serve to protect the photomask PM while the photomask PM is in a vacuum atmosphere, transferred to the mask stage 810, and/or in the vicinity thereof. When a pressure of the ambient environment is reduced from an atmospheric state to a vacuum state, and/or increased from the vacuum state to the atmospheric state, contamination particles may flow in whirls. As a result, contamination particles floating around the photomask PM may contaminate the photomask PM. The inner pod 882 may protect the photomask PM from the above-described environment and protect the photomask PM until the photomask PM is in a vacuum atmosphere, or until the photomask PM is transferred to the mask stage 810, and/or is in the vicinity of the mask stage 810.

In an exposure process of a semiconductor device manufacturing process, a pattern formed on a photomask (or reticle) may be projection-exposed on a wafer on which a resist film is formed so that a latent pattern may be formed on the resist film. A resist pattern may be formed on the wafer by using a developing process. However, when foreign materials, for example, particles, are present on the photomask, the foreign materials may be transferred onto the wafer along with the pattern and cause pattern failures.

A process (e.g., large-scale integration (LSI) or very-large-scale integration (VLSI)) of manufacturing a semiconductor device using ultrafine patterns may be performed by using a reduction projection exposure apparatus by which a pattern formed on a photomask may be reduction-projected on a resist film formed on a wafer to form a latent image pattern on the resist film. As the mounting density of semiconductor devices increases, the miniaturization of circuit patterns has been desired. Thus, a demand for the shrinkage of an exposure linewidth has increased in an exposure process. As a result, exposure techniques using exposure light having further reduced wavelengths has been developed to improve resolution of an exposure apparatus. Thus far, i-line (365 nm), KrF (Krypton difluoride) excimer laser (248 nm), ArF (argon fluoride) excimer laser (0.193 nm), and fluorine (F2) excimer laser (157 nm) exposure techniques have been developed. In recent years, an exposure apparatus using EUV light or e-beams having wavelengths for a soft X-ray range from at or about 6.75 nm to at or about 13.5 nm has been developed. When the wavelength of exposure light is reduced to a level of the wavelength of EUV light or e-beams, since the air does not transmit light in an atmospheric pressure, it may be necessary to put an optical path of exposure light in a high-vacuum environment. Accordingly, an optical system, a mask stage, and a wafer stage may be in a vacuum chamber having higher airtightness than an F2 exposure apparatus, and a loadlock chamber may be installed at an inlet/outlet port for each of the wafer and a photomask so that the wafer or the photomask may be loaded into or unloaded from the vacuum chamber while a degree of vacuum is maintained.

An EUV exposure process may be performed by using a reflective photomask including a multilayered reflective layer provided on a surface of a front layer on which a pattern region is formed.

When the wavelength of exposure light is reduced to a wavelength range of EUV light, an exposure process has been performed thus far without using a pellicle because selecting a transparent material for EUV is limited. Alternatively, the exposure process has been performed by using a pellicle including a thin pellicle membrane that is severely damaged due to heat during an exposure process and has a low tensile strength. In addition, to satisfy transmittance for EUV, a pellicle membrane having a very small thickness of several tens of nm or less may be needed as the pellicle membrane. However, since the pellicle membrane having the very small thickness has very low physical stiffness and a relatively high reflectance with respect to deep ultraviolet (DUV) light, the pellicle membrane may degrade resolution during an exposure process. Also, when a pellicle including the pellicle membrane having the small thickness is used, it may be very difficult to put the pellicle membrane into a freestanding state due to weak tensile strength of the pellicle membrane. Furthermore, the pellicle may be very vulnerable to thermal damage during an exposure process and may not limit and/or prevent the photomask from being contaminated with particles.

The IC device manufacturing apparatus 800 according to an example may protect the photomask PM by using the pellicle 820 during an exposure process using an EUV light source. The pellicle 820 according to example embodiments may include the porous thin film 120 (refer to FIGS. 1 and 5) including a plurality of nanowires arranged across one another to form a net-like structure. Thus, the pellicle 820 according to example embodiments may ensure a relatively great thickness sufficient for structural stability and have a relatively low optical density. As a result, an OoB reflectance of light having a wavelength of, for example, about 140 nm to about 300 nm may be reduced to improve the resolution of an exposure process. Also, since the porous thin film 120 is adopted, it may not be necessary to form an additional vent hole in the pellicle frame 150. Accordingly, a process of manufacturing a pellicle may be simple and easy. Thus, occurrence of errors due to degradation of a pellicle membrane may be effectively limited and/or prevented during an exposure process, and a pattern having a desired shape may be effectively transferred to a precise position of a wafer W to be exposed.

Figure 17:
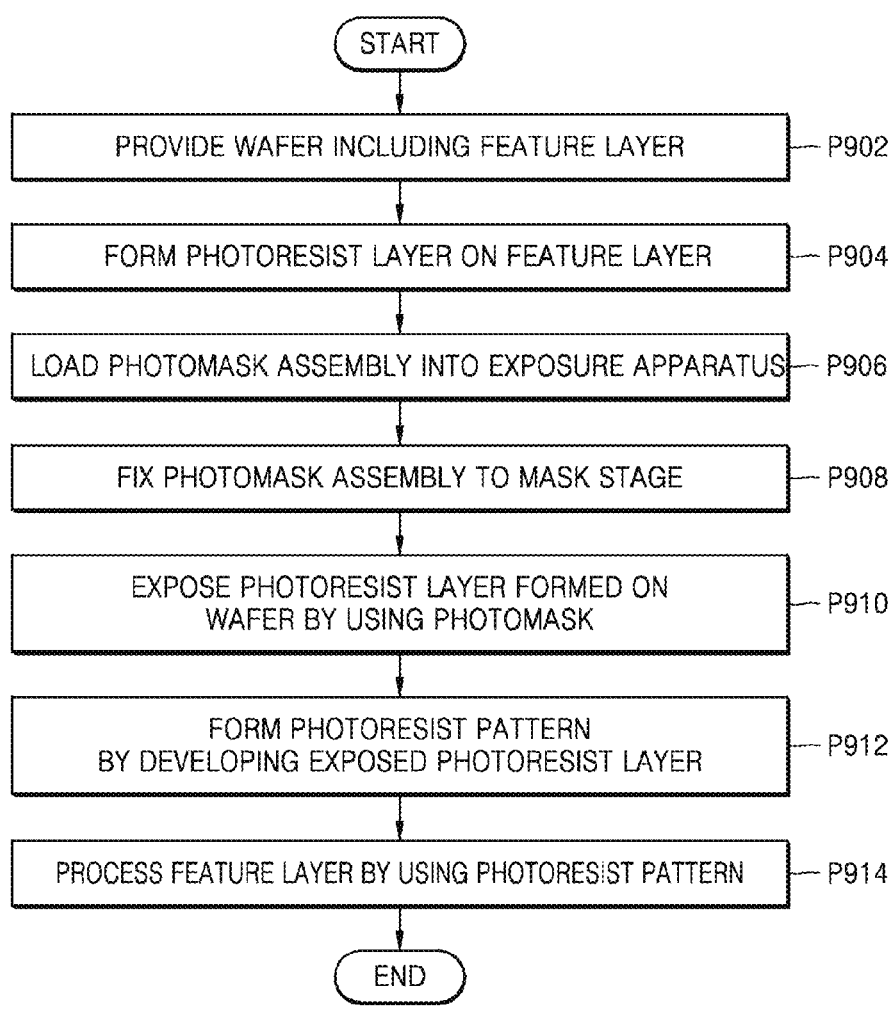
FIG. 17 is a flowchart of a method of manufacturing an IC device according to an example embodiment.

FIG. 17 is a flowchart of a method of manufacturing the IC device according to an example embodiment.

Referring to FIG. 17, in a process at P902, a wafer including a feature layer may be provided.

In at least some example embodiments, the feature layer may be a conductive layer and/or an insulating layer formed on the wafer. For example, the feature layer may include a metal, a semiconductor, or an insulating material. In some other example embodiments, the feature layer may be a portion of the wafer.

At P904, a photoresist film may be formed on the feature layer. In at least some example embodiments, the photoresist film may include an EUV (6.75 nm or 13.5 nm) resist material. In at least some other example embodiments, the photoresist film may include a F2 excimer laser (157 nm) resist material, an ArF excimer laser (193 nm) resist material, or a KrF excimer laser (248 nm) resist material. The photoresist film may include positive photoresist and/or negative photoresist.

In at least some example embodiments, to form the photoresist film including the positive photoresist, the following may be spin-coated on the feature layer: a photoresist composition including a photosensitive polymer having an acid-labile group, a potential acid, and a solvent.

In at least some example embodiments, the photosensitive polymer may include a (meth)acrylate-based polymer. The (meth)acrylate-based polymer may be an aliphatic (meth)acrylate-based polymer. For example, the photosensitive polymer may be, including but not limited to, polymethylmethacrylate $((CC_5O_2H_8)_n)$, poly(t-butylmethacrylate), poly(methacrylic acid), poly(norbornylmethacrylate), a binary or ternary copolymer of repeating units of the (meth)acrylate-based polymers, and/or a mixture thereof. Also, the above-described photosensitive polymers may be replaced by various acid-labile protecting groups. The protecting groups may include but not limited to, tert-butoxycarbonyl (t-BOC), tetrahydropyranyl, trimethylsilyl, phenoxyethyl, cyclohexenyl, tert-butoxycarbonylmethyl, tert-butyl, adamantyl, or a norbornyl group, but inventive concepts are not limited thereto.

In at least some example embodiments, the potential acid may include but not limited to, a photoacid generator (PAG), a thermoacid generator (TAG), and/or a combination thereof. In at least some example embodiments, the PAG may include a material capable of generating acid when exposed to any one light selected from EUV light (1 nm to 31 nm), an F2 excimer laser (157 nm), an ArF excimer laser (193 nm), and a KrF excimer laser (248 nm). The PAG may include but not limited to, onium salts, halides, nitrobenzyl esters, alkyl sulfonates, diazonaphthoquinones ($C_{10}H_6N_2O$), imino sulfonates, disulfones, diazomethanes, and/or sulfonyl oxy ketones.

At P906 of FIG. 17, a photomask assembly according to an example embodiment may be loaded into the exposure apparatus.

In at least some example embodiments, the photomask assembly may be any one of the photomask assemblies 600A and 600B described with reference to FIGS. 14 and 15, and photomask assemblies that are modified and/or changed within the scope of example embodiments of inventive concepts.

In at least some example embodiments, the photomask assembly may be loaded into a mask load port 800G of the IC device manufacturing apparatus 800 shown in FIG. 16.

At P908 of FIG. 17, the photomask assembly may be fixed to a mask stage.

In at least some example embodiments, the mask stage may be the mask stage 810 of the IC device manufacturing apparatus 800 shown in FIG. 16.

At P910, the photoresist film formed on the wafer may be exposed by using a photomask.

In at least some example embodiments, the exposure process may be performed in a reflective exposure system, but inventive concepts are not limited thereto. For example, the exposure process may be performed by using a transmissive exposure system.

At P912, a photoresist pattern may be formed by developing the exposed photoresist film.

At P914, the feature layer may be processed by the photoresist pattern.

In at least some example embodiments, to process the feature layer by using the process at P914, the feature layer may be etched by using the photoresist pattern as an etch mask to form a fine feature pattern.

In at least some example embodiments, to process the feature layer by using the process at P914, impurity ions may be implanted into the feature layer by using the photoresist pattern as an ion implantation mask.

In at least some example embodiments, to form the feature layer by using the process at P914, an additional process film may be formed on the feature layer exposed by the photoresist pattern formed in the process at P912. The process film may include a conductive film, an insulating film, a semiconductor film, and/or a combination thereof.

Figure 18A:
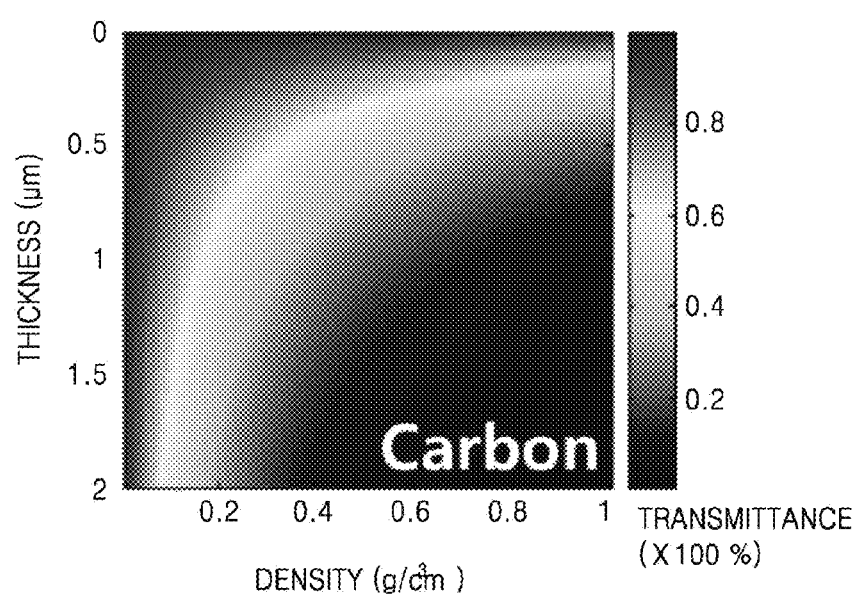
FIGS. 18A and 18B are graphs showing estimation results of extreme ultraviolet (EUV) transmittance relative to the density of a plurality of nanowires, and the thickness of a porous thin film included in a pellicle membrane of a pellicle according to an example embodiment.
Figure 18B:
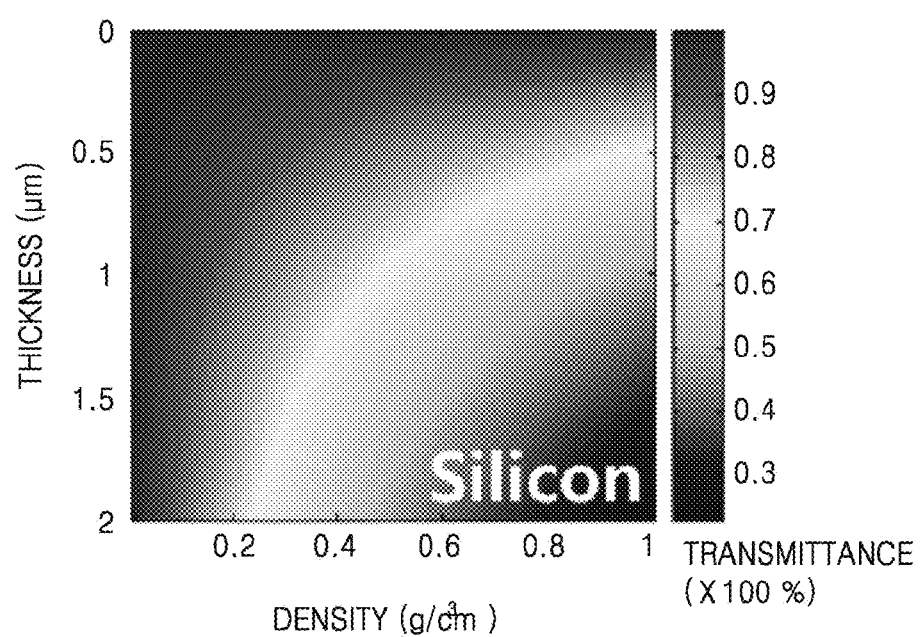

FIGS. 18A and 18B are graphs showing estimation results of extreme ultraviolet (EUV) transmittance relative to the density of a plurality of nanowires, and the thickness of a porous thin film included in a pellicle membrane included in a pellicle according to an example embodiment.

FIG. 18A shows estimation results of EUV transmittance in a case in which a plurality of nanowires included in a porous thin film include carbon (C). FIG. 18B shows estimation results of EUV transmittance in a case in which a plurality of nanowires included in a porous thin film include silicon (Si).

In general, since EUV light has a relatively short wavelength of about 13.5 nm, most materials may show high absorbance of EUV light. However, the pellicle membrane according to example embodiments may have a very low surface density and a high light transmittance because a plurality of nanowires included in the pellicle membrane are arranged across one another to form a regular or irregular net structure.

From the results of FIGS. 18A and 18B, it can be ascertained that a pellicle membrane manufactured using a plurality of nanowires including carbon (C) or silicon (Si) by a method according to example embodiments has a very high EUV transmittance when the pellicle membrane has a relatively great thickness of about 1 μm.

Figure 19:
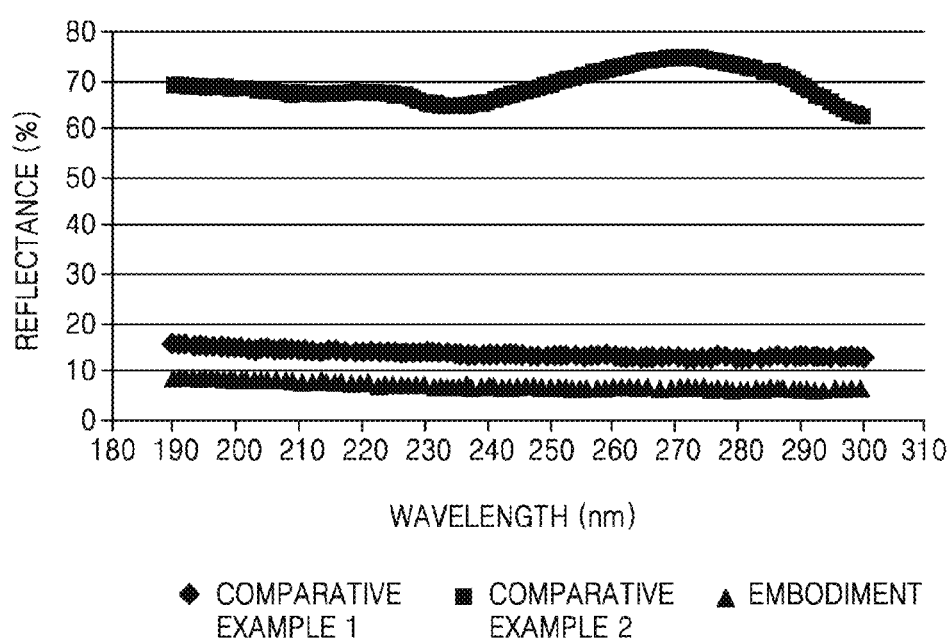
FIG. 19 is a graph showing results of comparison between an out-of-band (OoB) reflectance of a pellicle membrane including a plurality of nanowires of a pellicle according to an example embodiment, and OoB reflectance of comparative examples.

FIG. 19 is a graph showing results of comparison between an out-of-band (OoB) reflectance of a pellicle membrane including a plurality of nanowires included in a pellicle according to an example embodiment and OoB reflectance of Comparative examples 1 and 2.

In FIG. 19, "Embodiment" shows estimation results of a silicon porous thin film having a relatively great thickness of about 1 μm (micrometer) in a case in which a pellicle membrane includes a porous thin film manufactured using a plurality of silicon nanowires by a method according to example embodiments. "Comparative example 1" shows estimation results of a bulk carbon (C) film having a thickness of about 16 nm (nanometer), and "Comparative example 2" shows estimation results of a bulk silicon film having a thickness of about 57 nm.

From the results of FIG. 19, it can be seen that a reflectance of DUV light (about 190 nm to about 300 nm) is lower in "Embodiment" than in "Comparative example 1" and "Comparative example 2". Thus, it can be seen that since a pellicle according to example embodiments includes a pellicle membrane including a porous thin film having a plurality of nanowires arranged across one another to form a net structure, a higher resolution may be obtained in an exposure process using EUV light than when a pellicle membrane including a bulk material is used.

Figure 20:
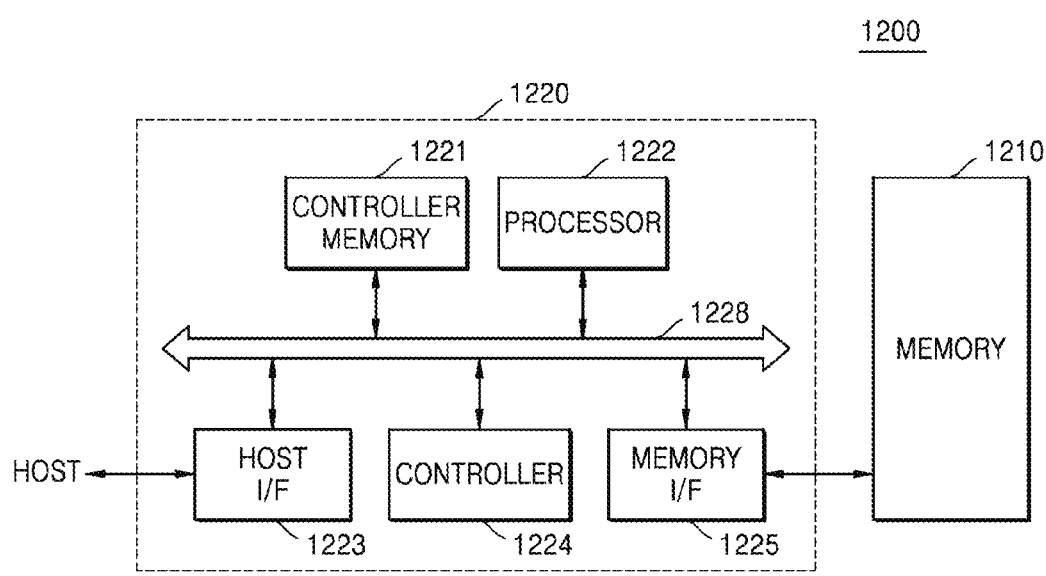
FIG. 20 is a block diagram of a memory card including an IC device manufactured by using an IC device manufacturing apparatus according to an example embodiment.

FIG. 20 is a block diagram of a memory card 1200 including an IC device manufactured by using an IC device manufacturing apparatus according to example embodiments.

The memory card 1200 may include a memory controller 220 configured to generate a command and address signal C/A and a memory 1210, for example, a flash memory including but not limited to, one flash memory device or a plurality of flash memory devices. The memory controller 1220 may include a host interface 1223 configured to transmit e command and address signal C/A to a host, or receive the command and address signal C/A from the host, and a memory interface 1225 configured to transmit the command and address signal C/A to the memory 1210 again, or receive the command and address signal C/A from the memory 1210. The host interface 1223, the controller 1224, and the memory interface 1225 may communicate with a controller memory (e.g., SRAM) 1221 and a processor (e.g., a CPU) 1222 via a common bus 1228.

The memory 1210 may receive a command and an address signal from the memory controller 1220, store data in at least one of memory devices in the memory 1210 in response to the command and the address signal, and search for data from at least one of the memory device. Each of the memory devices may include a plurality of addressable memory cells and a decoder configured to receive the command and the address signal and generate a row signal and a column signal to access at least one of the addressable memory cells during program and read operations.

Each of components of the memory card 1200 including the memory controller 1220, which includes a controller memory 1221, a processor 1222, a host interface 1223, a controller 1224, a memory interface 1225, and the memory 1210 may include a pellicle according to example embodiments, a photomask assembly according to example embodiments, or an IC device manufactured by using an IC device manufacturing apparatus including the pellicle and the photomask assembly. Also, each of the components of the memory card 1200 including the memory controller 1220, which includes the controller memory 1221, the processor 1222, the host interface 1223, the controller 1224, the memory interface 1225, and the memory 1210 may include an IC device manufactured by the method of manufacturing the IC device as described with reference to FIG. 17.

Figure 21:
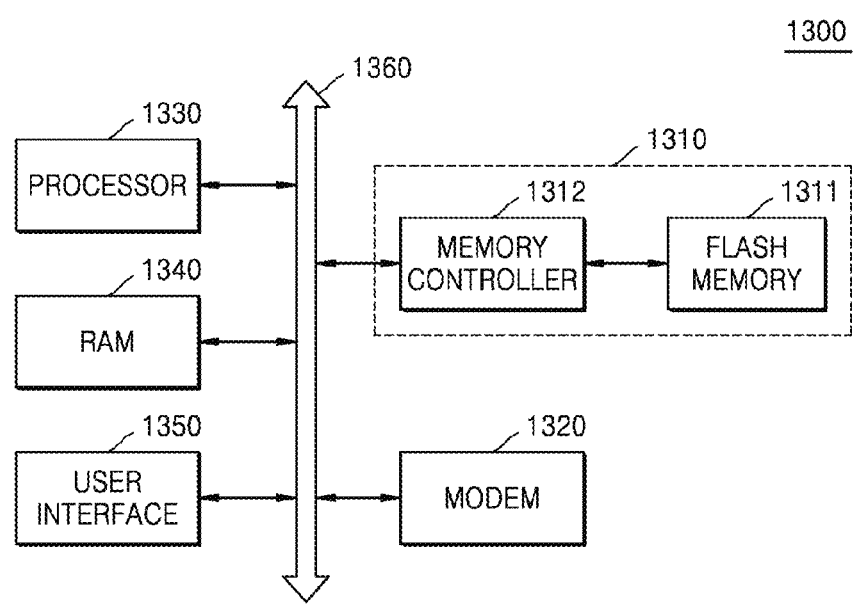
FIG. 21 is a block diagram of a memory system comprising a memory card including an IC device manufactured by a method of manufacturing an IC device according to an example embodiment.

FIG. 21 is a block diagram of a memory system 1300 adopting a memory card 1310 including an IC device manufactured by using a method of manufacturing an IC device according to an example embodiment.

The memory system 1300 may include a processor 1330 (e.g., a CPU), random access memory (RAM) 1340, a user interface 1350, and a modem 1320, which may communicate with one another via a common bus 1360. Each of the elements of the memory system 1300 may transmit a signal to the memory card 1310 and receive the signal from the memory card 1310 via the common bus 1360. Each of components of the memory system 1300 including the memory card 1310, the processor 1330, the RAM 1340, the user interface 1350, and the modem 1320 may include a pellicle according to example embodiments, a photomask assembly according to example embodiments, or an IC device manufactured by using an IC device manufacturing apparatus including the pellicle and the photomask assembly. The memory system 1300 may include an IC device manufactured by using the method of manufacturing the IC device, which is described with reference to FIG. 17.

The memory system 1300 may be applied in fields of various electronic applications. For example, the memory system 1300 may be applied to solid-state drives (SSDs), CMOS image sensors (CISs), and computer application chipsets.

The memory system 1300 may be packaged by using any one of packages having various shapes, for example, including but not limited to, ball grid arrays (BGAs), chip-scale packages (CSPs), plastic leaded chip carrier (PLCC), plastic dual in-line packages (Pall's), multi-chip packages MCPs), wafer-level fabricated packages (WFPs), and wafer-level processed stock packages (WSPs), but inventive concepts are not limited thereto.

It should be understood that example embodiments described herein should be considered in a descriptive sense only and not for purposes of limitation. Descriptions of features or aspects within each device or method according to example embodiments should typically be considered as available for other similar features or aspects in other devices or methods according to example embodiments. While inventive concepts have been particularly shown and described with reference to example embodiments, it will be understood by one of ordinary skill in the art that various changes in form and details may be made therein without departing from the spirit and scope of the following claims.

What is claimed is:

1. A pellicle comprising:
a pellicle membrane including a porous film, the porous film including a plurality of nanowires, each of the plurality of nanowires are patterned across one another.

2. The pellicle of claim 1, wherein the plurality of nanowires define a plurality of holes that extend along a thickness of the porous film.

3. The pellicle of claim 2, wherein the plurality of nanowires define the plurality of holes such that the plurality of holes extend along at least one of a linear path and a nonlinear path.

4. The pellicle of claim 2, wherein the plurality of nanowires define the plurality of holes such that the plurality of holes includes a plurality of irregularly patterned through holes.

5. The pellicle of claim 2, wherein the plurality of nanowires define the plurality of holes such that the plurality of holes includes a plurality of regularly patterned through holes.

6. The pellicle of claim 1, wherein each of the plurality of nanowires includes one of a circular sectional shape, an elliptical sectional shape, and a polygonal sectional shape.

7. The pellicle of claim 1, wherein the plurality of nanowires are in at least one of an unfolded state and a folded state, the plurality of nanowires extend in a lengthwise.

8. The pellicle of claim 1, wherein each of the plurality of nanowires includes a single element.

9. The pellicle of claim 1, wherein each of the plurality of nanowires includes a hetero structure, the hetero structure includes at least two different elements.

10. The pellicle of claim 1, wherein the plurality of nanowires include a material selected from the group consisting of silicon (Si), carbon (C), nickel (Ni), platinum (Pt), gold (Au), ruthenium (Ru), indium phosphide (InP), gallium nitride (GaN), silicon nitride ($Si_3N_4$), silicon dioxide ($SiO_2$), titanium dioxide ($TiO_2$), yttrium barium copper oxide (YBCO), and silicon carbide (SiC), and a combination thereof.

11. The pellicle of claim 1, wherein each of the plurality of nanowires includes an element doped with at least one of an n-type dopant and a p-type dopant.

12. The pellicle of claim 1, wherein at least one of the plurality of nanowires includes a core wire and a shell wire, and the shell wire surrounds the core wire.

13. A pellicle membrane comprising:
a porous film including a first surface, and
a plurality of nanowires in the porous film, a first nanowire of the plurality of nanowires being unified with a second nanowire of the plurality of nanowires, the first nanowire and the second nanowire being patterned across one another, the first surface being thicker than each of the plurality of nanowires.

14. The pellicle membrane of claim 13, wherein,
each of the plurality of nanowires includes one of a circular sectional shape, an elliptical sectional shape, and a polygonal sectional shape.

15. The pellicle membrane of claim 13, wherein the plurality of nanowires define a plurality of holes that extend along a thickness of the porous film.

16. The pellicle membrane of claim 15, wherein the plurality of nanowires define the plurality of holes such that the plurality of holes extends along at least one of a linear path and a nonlinear path.

17. A pellicle comprising:
a pellicle membrane including a porous film, the porous film including a plurality of nanowires,
wherein the porous film has a plurality of holes penetrating the porous film, and the plurality of holes are irregularly arranged.

18. The pellicle of claim 17, wherein the plurality of holes are irregularly shaped.

19. The pellicle of claim 17, wherein each of the plurality of holes penetrates the porous film along a nonlinear path.

20. The pellicle of claim 17, wherein each of the plurality of holes is defined by the plurality of nanowires.

* * * * *